United States Patent
Uzoh et al.

(10) Patent No.: US 12,557,615 B2
(45) Date of Patent: Feb. 17, 2026

(54) METHODS FOR BONDING SEMICONDUCTOR ELEMENTS

(71) Applicant: ADEIA SEMICONDUCTOR TECHNOLOGIES LLC, San Jose, CA (US)

(72) Inventors: Cyprian Emeka Uzoh, San Jose, CA (US); Laura Wills Mirkarimi, Sunol, CA (US)

(73) Assignee: ADEIA SEMICONDUCTOR TECHNOLOGIES LLC, San Jose, CA (US)

( * ) Notice: Subject to any disclaimer, the term of this patent is extended or adjusted under 35 U.S.C. 154(b) by 530 days.

(21) Appl. No.: 18/064,551

(22) Filed: Dec. 12, 2022

(65) Prior Publication Data
US 2023/0187264 A1    Jun. 15, 2023

Related U.S. Application Data

(60) Provisional application No. 63/289,059, filed on Dec. 13, 2021.

(51) Int. Cl.
*H01L 21/762* (2006.01)
*H01L 21/02* (2006.01)
(Continued)

(52) U.S. Cl.
CPC .. *H01L 21/76202* (2013.01); *H01L 21/02164* (2013.01); *H01L 21/02274* (2013.01);
(Continued)

(58) Field of Classification Search
CPC ....... H01L 21/2007; H01L 2224/80894; H01L 2224/80895; H01L 2224/80896
See application file for complete search history.

(56) References Cited

U.S. PATENT DOCUMENTS 5,421,953 A * 6/1995 Nagakubo ............. B29C 65/004
216/34
5,753,536 A   5/1998 Sugiyama et al.
(Continued)

FOREIGN PATENT DOCUMENTS

JP    2013-033786 A    2/2013
JP    2018-160519      10/2018
WO    WO 2005/043584 A2    5/2005

OTHER PUBLICATIONS

Iwai, T. et al., "Influence of microwave annealing on optical and electrical properties of plasma-induced defect structures in Si substrate," Journal of Vacuum Science & Technology A, 2015, vol. 33, Issue 6, pp. 061403-1-061403-9.
(Continued)

*Primary Examiner* — Erik Kielin
(74) *Attorney, Agent, or Firm* — Knobbe, Martens, Olson & Bear, LLP

(57) ABSTRACT

Disclosed herein are methods for direct bonding. In some embodiments, the direct bonding method includes microwave annealing a dielectric bonding layer of a first element by exposing the dielectric bonding layer to microwave radiation and then directly bonding the dielectric bonding layer of the first element to a second element without an intervening adhesive. The bonding method also includes depositing the dielectric bonding layer on a semiconductor portion of the first element at a first temperature and microwave annealing the dielectric bonding layer at a second temperature lower than the first temperature.

23 Claims, 12 Drawing Sheets

(51) Int. Cl.
*H01L 21/20* (2006.01)
*H01L 21/304* (2006.01)
*H01L 21/3205* (2006.01)
*H01L 21/324* (2006.01)
*H01L 21/768* (2006.01)

(52) U.S. Cl.
CPC .... *H01L 21/02345* (2013.01); *H01L 21/2007* (2013.01); *H01L 21/304* (2013.01); *H01L 21/32051* (2013.01); *H01L 21/324* (2013.01); *H01L 21/76898* (2013.01)

(56) References Cited

U.S. PATENT DOCUMENTS

| | | | |
|---|---|---|---|
| 5,771,555 A | 6/1998 | Eda et al. | |
| 5,904,860 A * | 5/1999 | Nagakubo | C04B 37/001 216/34 |
| 6,080,640 A | 6/2000 | Gardner et al. | |
| 6,423,640 B1 | 7/2002 | Lee et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,385,024 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,522,499 B2 | 12/2019 | Enquist et al. | |
| 10,707,087 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,004,757 B2 | 5/2021 | Katkar et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,573 B2 | 10/2021 | Uzoh et al. | |
| 11,158,606 B2 | 10/2021 | Gao et al. | |
| 11,169,326 B2 | 11/2021 | Huang et al. | |
| 11,171,117 B2 | 11/2021 | Gao et al. | |
| 11,176,450 B2 | 11/2021 | Teig et al. | |
| 11,195,748 B2 | 12/2021 | Uzoh et al. | |
| 11,205,625 B2 | 12/2021 | DeLaCruz et al. | |
| 11,244,920 B2 | 2/2022 | Uzoh | |
| 11,256,004 B2 | 2/2022 | Haba et al. | |
| 11,264,357 B1 | 3/2022 | DeLaCruz et al. | |
| 11,276,676 B2 | 3/2022 | Enquist et al. | |
| 11,296,044 B2 | 4/2022 | Gao et al. | |
| 11,296,053 B2 | 4/2022 | Uzoh et al. | |
| 11,329,034 B2 | 5/2022 | Tao et al. | |
| 11,348,898 B2 | 5/2022 | DeLaCruz et al. | |
| 11,355,404 B2 | 6/2022 | Gao et al. | |
| 11,355,443 B2 | 6/2022 | Huang et al. | |
| 11,367,652 B2 | 6/2022 | Uzoh et al. | |
| 11,373,963 B2 | 6/2022 | DeLaCruz et al. | |
| 11,380,597 B2 | 7/2022 | Katkar et al. | |
| 11,385,278 B2 | 7/2022 | DeLaCruz et al. | |
| 11,387,202 B2 | 7/2022 | Haba et al. | |
| 11,387,214 B2 | 7/2022 | Wang et al. | |
| 11,393,779 B2 | 7/2022 | Gao et al. | |
| 11,462,419 B2 | 10/2022 | Haba | |
| 11,476,213 B2 | 10/2022 | Haba et al. | |
| 11,515,291 B2 | 11/2022 | DeLaCruz et al. | |
| 2004/0084414 A1 | 5/2004 | Sakai et al. | |
| 2006/0057945 A1 | 3/2006 | Hsu et al. | |
| 2007/0111386 A1 | 5/2007 | Kim et al. | |
| 2008/0303118 A1* | 12/2008 | Arena | H01L 21/02002 117/200 |
| 2010/0190000 A1* | 7/2010 | Faure | H01L 21/76254 156/247 |
| 2011/0076787 A1* | 3/2011 | Ahmad | H01L 21/67248 257/E21.53 |
| 2014/0175655 A1 | 6/2014 | Chen et al. | |
| 2015/0064498 A1 | 3/2015 | Tong | |
| 2016/0343682 A1 | 11/2016 | Kawasaki | |
| 2018/0175012 A1 | 6/2018 | Wu et al. | |

(56) References Cited

U.S. PATENT DOCUMENTS

| | | |
|---|---|---|
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0019721 A1* | 1/2019 | Erk ............... H01L 21/02164 |
| 2019/0115277 A1 | 4/2019 | Yu et al. |
| 2019/0131277 A1 | 5/2019 | Yang et al. |
| 2019/0333550 A1 | 10/2019 | Fisch |
| 2019/0385935 A1 | 12/2019 | Gao et al. |
| 2020/0013765 A1 | 1/2020 | Fountain, Jr. et al. |
| 2020/0035641 A1 | 1/2020 | Fountain, Jr. et al. |
| 2020/0294908 A1 | 9/2020 | Haba et al. |
| 2020/0328162 A1 | 10/2020 | Haba et al. |
| 2020/0328186 A1* | 10/2020 | Liu .................. H01L 25/0657 |
| 2020/0395321 A1 | 12/2020 | Katkar et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | DeLaCruz et al. |
| 2021/0193624 A1 | 6/2021 | DeLaCruz et al. |
| 2021/0193625 A1 | 6/2021 | Katkar et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0096191 A1 | 3/2025 | Gao et al. |
| 2025/0112123 A1 | 4/2025 | Katkar et al. |
| 2025/0185163 A1 | 6/2025 | Zhao et al. |
| 2025/0210585 A1 | 6/2025 | Fountain, Jr. et al. |
| 2025/0212554 A1 | 6/2025 | Katkar et al. |
| 2025/0218903 A1 | 7/2025 | Uzoh et al. |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Kimura, M. et al., "Investigation of implantation damage recovery using microwave annealing for high performance image sensing devices," ITE Trans. on MTA, 2016, vol. 4, No. 2, pp. 85-90.

Lee, I.K. et al., "Microwave annealing effect for highly reliable biosensor: dual-gate ion-sensitive field-effect transistor using amorphous InGaZnO thin-film transistor," ACS Appl Mater Interfaces, Dec. 2014, vol. 6, No. 24, pp. 22680-22686.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Pankratov, E.L., "Redistribution of dopant during microwave annealing of a multilayer structure for production p-n junction," Journal of Applied Physics, 2008, vol. 103, Issue 6, pp. 064320-1-064320-10.

Plobi, A. et al., "Wafer direct bonding: tailoring adhesion between brittle materials," Materials Science and Engineering Review Journal, 1999, R25, 88 pages.

Zhang, Q.X. et al., "The effects of rapid thermal annealing and microwave annealing on the electrical properties of ZrO2 metal-insulator-metal capacitors," Optik, Feb. 2019, vol. 179, pp. 1057-1062.

(56) References Cited

OTHER PUBLICATIONS

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Kowalski et al., "Microwave annealing for low temperature activation". In 2007 15th International Conference on Advanced Thermal Processing of Semiconductors Oct. 2, 2007 (pp. 51-56). IEEE.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "Onsemi AR0820.".

Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).

\* cited by examiner

METHODS FOR BONDING SEMICONDUCTOR ELEMENTS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit under 35 U.S.C. § 119 (e) to U.S. Provisional Application No. 63/289,059, entitled "METHODS FOR BONDING SEMICONDUCTOR ELEMENTS," filed Dec. 13, 2021, the entirety of which is hereby incorporated by reference herein.

BACKGROUND

Field of the Invention

The field relates to methods for bonding semiconductor elements and, in particular, to reducing warpage of semiconductor elements.

Description of the Related Art

Semiconductor elements, such as semiconductor wafers or integrated device dies, can be stacked and directly bonded to one another without an adhesive. For example, non-conductive (dielectric or semiconductor) surfaces can be made extremely smooth and treated to enhance direct, covalent bonding, even at room temperature and without application of pressure beyond contact. In some hybrid direct bonded structures, non-conductive field regions of the elements can be directly bonded to one another, and corresponding conductive contact structures can be directly bonded to one another. In some applications, the semiconductor elements may be warped prior to bonding, which can prevent strong bonds or, in the case of hybrid direct bonding, reduce electrical connectivity between opposing contact structures. Accordingly, there remains a continuing need for improved methods for reducing warpage of semiconductor elements.

SUMMARY OF THE INVENTION

In one embodiment, a bonding method can include: microwave annealing a dielectric bonding layer of a first element by exposing the dielectric bonding layer to microwave radiation; and after the microwave annealing, directly bonding the dielectric bonding layer of the first element to a second element without an intervening adhesive.

In some embodiments, the bonding method includes depositing the dielectric bonding layer on a semiconductor portion of the first element at a first temperature and microwave annealing the dielectric bonding layer at a second temperature lower than the first temperature. In some embodiments, the first temperature is in a range of 180° C. to 350° C. In some embodiments, the bonding method includes the second temperature is in a range of 20° C. to 175° C. In some embodiments, depositing the dielectric bonding layer comprises plasma depositing the dielectric bonding layer. In some embodiments, plasma depositing comprises depositing by plasma enhanced chemical vapor deposition (PECVD). In some embodiments, the bonding method also includes plasma depositing at a temperature less than 170° C. In some embodiments, the bonding method also includes thinning the first element. In some embodiments, the bonding method also includes polishing the dielectric bonding layer after the microwave annealing. In some embodiments, the bonding method also includes activating for direct bonding after the polishing. In some embodiments, the bonding method also includes thermally heating the dielectric bonding layer during the microwave annealing. In some embodiments, the dielectric bonding layer is not thermally heating in a furnace during the microwave annealing. In some embodiments, microwave annealing comprises exposing the dielectric bonding layer to a plurality of different microwave frequencies. In some embodiments, microwave annealing comprises exposing the dielectric bonding layer to one or a plurality of frequencies in a range of 2 GHz to 15 GHz. In some embodiments, the bonding method also includes directly bonding a plurality of conductive contacts at least partially embedded in the dielectric bonding layer to a plurality of conductive contacts of the second element without an intervening adhesive. In some embodiments, the bonding method also includes forming the plurality of conductive contacts in the dielectric bonding layer after the microwave annealing, and subsequently performing a second microwave anneal to densify the plurality of conductive contacts. In some embodiments, the bonding method also includes, after the directly bonding, performing an additional microwave anneal to increase a bond strength between the first and second elements. In some embodiments, the bonding method also includes providing a dielectric liner in the first element, and, after providing the dielectric liner, performing an additional microwave anneal to densify the dielectric liner. In some embodiments, the bonding method also includes: providing a plurality of through substrate vias (TSVs) exposed through a back side of the first element; providing a dielectric layer over the exposed TSVs; and after providing the dielectric layer, additionally microwave annealing the element to densify the dielectric layer. In some embodiments, providing the plurality of TSVs comprises providing the plurality of TSVs before the directly bonding. In some embodiments, providing the plurality of TSVs comprises providing the plurality of TSVs after the directly bonding. In some embodiments, the bonding method also includes directly bonding the first element in wafer form to the second element in wafer form. In some embodiments, the bonding method also includes directly bonding the first element in singulated die form to the second element.

In another embodiment, a method of forming a semiconductor element includes: depositing a dielectric bonding layer on a semiconductor portion at a first temperature; after the depositing, microwave annealing the dielectric bonding layer by exposing the dielectric bonding layer to microwave radiation at a second temperature lower than the first temperature to densify the dielectric bonding layer; and preparing the dielectric bonding layer for direct bonding to another element.

In some embodiments, the first temperature is in a range of 150° C. to 350° C. In some embodiments, the second temperature is in a range of 20° C. to 175° C. In some embodiments, the dielectric bonding layer comprises silicon oxide. In some embodiments, preparing the dielectric bonding layer for direct bonding comprises activating the dielectric bonding layer by exposing the dielectric bonding layer to a nitrogen plasma. In some embodiments, depositing comprises plasma depositing.

In another embodiment, a method for forming a semiconductor element includes: forming a cavity in the semiconductor element; forming a dielectric liner in the cavity at a first temperature; and after the forming, microwave annealing the semiconductor element by exposing the semiconductor element to microwave radiation at a second temperature lower than the first temperature to densify the dielectric liner.

In some embodiments, the method also includes, after the microwave annealing, providing a conductive layer in the cavity. In some embodiments, providing the conductive layer comprises providing a conductive through substrate via (TSV) in the semiconductor element.

In another embodiment, a bonding method includes: directly bonding a dielectric bonding layer of a first semiconductor element to a second element without an intervening adhesive to form a bonded structure; and after the directly bonding, microwave annealing the bonded structure to increase a bond strength of the bonded structure by exposing the bonded structure to microwave radiation.

In some embodiments, the method also includes directly bonding a plurality of conductive contacts at least partially embedded in the dielectric bonding layer to a plurality of conductive contacts in the second semiconductor element without an intervening adhesive. In some embodiments, the method also includes depositing the dielectric bonding layer on a semiconductor portion of the first semiconductor element, and, after the depositing but before the directly bonding, microwave annealing the semiconductor element to densify the dielectric bonding layer. In some embodiments, depositing is performed at a first temperature and the annealing the first semiconductor element is performed at a second temperature lower than the first temperature.

In another embodiment, a method for forming a semiconductor element includes: forming a cavity in a dielectric layer of the semiconductor element; providing a conductive layer in the cavity; and after providing the conductive layer, microwave annealing the first semiconductor element by exposing the semiconductor element to microwave radiation to densify the conductive layer.

In some embodiments, the method also includes planarizing the semiconductor element to form a planar bonding surface and directly bonding the semiconductor element to another semiconductor element without an intervening adhesive.

In another embodiment, a method for forming a semiconductor element includes: providing a plurality of through substrate vias (TSVs) exposed through a back side of the semiconductor element; providing a dielectric layer over the exposed TSVs; and after providing the dielectric layer, microwave annealing the semiconductor element to densify the dielectric layer.

In some embodiments, the method also includes planarizing the back side of the semiconductor element including the TSVs and directly bonding the back side of the semiconductor element to another semiconductor element without an intervening adhesive. In some embodiments, the method also includes mounting the semiconductor element to a carrier with an adhesive during the providing the dielectric layer and during the microwave annealing. In some embodiments, providing the dielectric layer comprises plasma depositing the dielectric layer at a temperature less than 170° C.

In another embodiment, a method for forming a semiconductor element includes: forming a dielectric layer on an element; microwave annealing the element; and forming a cavity in the element.

In some embodiments, microwave annealing the element comprises exposing the element to microwave radiation at a second temperature lower than a first temperature at which the dielectric layer was formed to densify the dielectric liner. In some embodiments, the method also includes forming a conductive layer in the cavity of in element. In some embodiments, the method also includes annealing the formed metal by microwave annealing. In some embodiments, the method also includes planarizing the element to form a bonding surface having a planar dielectric portion and an embedded conductive layer.

In another embodiment, a method for reducing the warpage of an element includes: measuring the warpage of an element; and exposing the warped element to microwave radiation at a temperature in a range of −25° C. to 150° C. to reduce the warpage of the element to or below a determined value.

In some embodiments, the warped element having an off specification warpage, larger than the determined value. In some embodiments, the warped element comprises a wafer or a singulated element. In some embodiments, the exposing the warped element to microwave radiation is performed while the warped element is disposed on a dicing sheet. In some embodiments, the method also includes cleaning the bonding surface of the restored warped element and bonding the bonding surface of the restored element to another substrate.

In another embodiment, a bonding method includes: exposing a dielectric bonding layer of a first element to microwave radiation; and after exposing the dielectric bonding layer to microwave radiation, directly bonding the dielectric bonding layer of the first element to a second element without an intervening adhesive.

In another embodiment, a method of forming a microelectronic assembly includes: preparing a bonding surface of a first substrate; preparing a bonding surface of a second substrate; mounting the second substrate to a dicing frame; singulating the second substrate into a plurality of dies while the second substrate is mounted to the dicing frame; activating the bonding surface of the first substrate; directly bonding the bonding surface of one of the plurality of singulated dies to the bonding surface of the first substrate without an adhesive to form the microelectronic assembly; and annealing the microelectronic assembly in a microwave oven or in ambient conditions.

In some embodiments, the method can include singulating the microelectronic assembly. In some embodiments, the first or second substrate comprises a partially embedded conductive layer formed at the respective first or second bonding surface. In some embodiments, the microelectronic assembly is microwave annealed at a temperature that is less than 200° C. In some embodiments, the microelectronic assembly is microwave annealed at a temperature that is less than 180° C. In some embodiments, at least one of the first and second substrates comprises one or metal recesses having a depth that is less than 30 nm, less than 20 nm, or less than 10 nm. In some embodiments, the first substrate comprises a first conductive layer, the singulated die comprises a second conductive layer, and directly bonding the bonding surface of the singulated die to the bonding surface of the first substrate without an adhesive comprises bonding the singulated die and the first such that the first conductive layer contacts the second conductive layer.

DETAILED DESCRIPTION OF THE PREFERRED EMBODIMENT

Figure 1A:
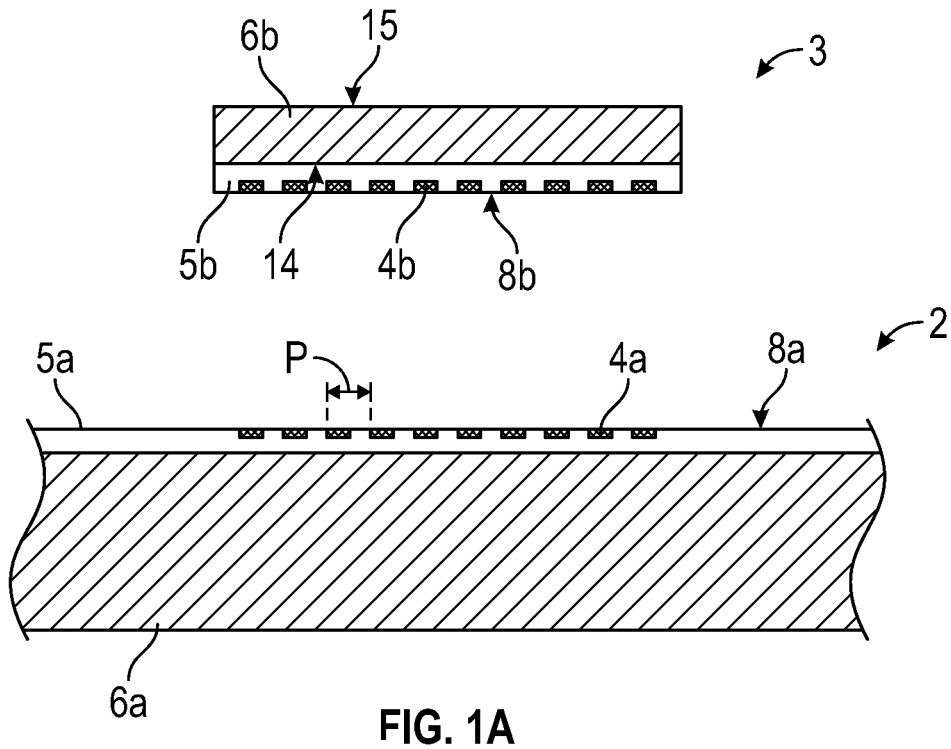
FIGS. 1A and 1B are schematic side sectional views showing various steps of the direct bonding process according to some embodiments.
Figure 1B:
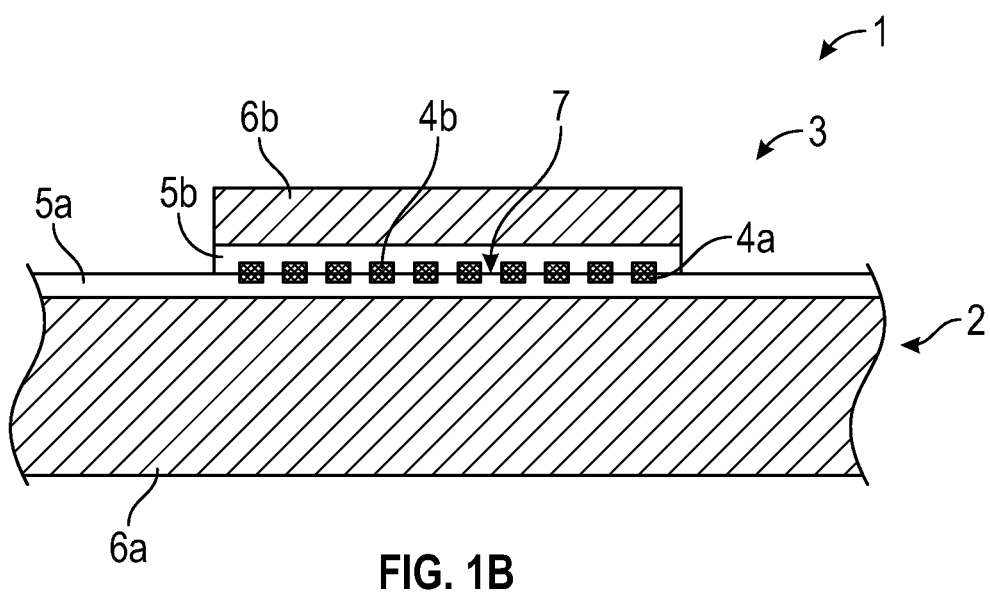

With reference initially to FIGS. 1A and 1B, various embodiments disclosed herein relate to directly bonded structures 1 in which two elements 2, 3 can be directly bonded to one another without an intervening adhesive. While the illustrated embodiment involves direct hybrid bonding of conductive and non-conductive elements, the skilled artisan will appreciate that the advantages and principles taught herein also apply to direct bonding of non-conductive surfaces.

A bonded structure comprises two elements that can be directly bonded to one another without an intervening adhesive. Two or more semiconductor elements (such as integrated device dies, wafers, etc.) 2, 3 may be stacked on or bonded to one another to form a bonded structure 1. Conductive features (e.g., contact pads 4a, exposed ends of vias (e.g., TSVs), or through substrate electrodes) of a first element 2 may be electrically connected to corresponding conductive features (e.g., contact pads 4b) of a second element 3. Any suitable number of elements can be stacked in the bonded structure 1. For example, a third element (not shown) can be stacked on the second element 3, a fourth element (not shown) can be stacked on the third element, etc. Additionally or alternatively, one or more additional elements (not shown) can be stacked laterally adjacent one another along the first element 2. In some embodiments, the laterally stacked additional element may be smaller than the second element. In some embodiments, the laterally stacked additional element may be at least two times smaller than the second element.

In some embodiments, the elements 2, 3 are directly bonded to one another without an adhesive. In various embodiments, a non-conductive field region that includes a non-conductive or dielectric material can serve as a first bonding layer 5a of the first element 2 which can be directly bonded to a corresponding non-conductive field region that includes a non-conductive or dielectric material serving as a second bonding layer 5b of the second element 3 without an adhesive. The non-conductive bonding layers 5a, 5b can be disposed on respective front sides 14 of device portions 6a, 6b, such as a semiconductor (e.g., silicon) portion of the elements 2, 3. Active devices and/or circuitry can be patterned and/or otherwise disposed in or on the device portions 6a, 6b. Active devices and/or circuitry can be disposed at or near the front sides of the device portions 6a, 6b, and/or at or near opposite backsides of the device portions 6a, 6b. The non-conductive material can be referred to as a non-conductive bonding region or bonding layer 5a of the first element 2. In some embodiments, the non-conductive bonding layer 5a of the first element 2 can be directly bonded to the corresponding non-conductive bonding layer 5b of the second element 3 using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 5a and/or 5b can comprise a non-conductive material such as a dielectric material, such as silicon oxide, or an undoped semiconductor material, such as undoped silicon. Suitable dielectric bonding surface or materials for direct bonding include but are not limited to inorganic dielectric materials, such as silicon oxide, silicon nitride, fluorinated oxides, fluorinated silicon glass (FSG), or silicon oxynitride, or can include carbon, such as silicon carbide, silicon oxycarbonitride, low K dielectric materials, SICOH dielectrics, silicon carbonitride, or a diamond-like carbon or a material comprising of a diamond surface. Such carbon-containing ceramic materials can be considered inorganic, despite the inclusion of carbon. In some embodiments, the dielectric materials may not comprise polymer materials, such as epoxy, resin, or molding materials.

In various embodiments, direct hybrid bonds can be formed without an intervening adhesive. For example, non-conductive bonding surfaces 8a, 8b can be polished to a high degree of smoothness. The bonding surfaces 8a, 8b can be cleaned and exposed to a plasma and/or etchants to activate the surfaces 8a, 8b. In some embodiments, the surfaces 8a, 8b can be terminated with a species after activation or during activation (e.g., during the plasma and/or etch processes). Without being limited by theory, in some embodiments, the activation process can be performed to break chemical bonds at the bonding surfaces 8a, 8b, and the termination process can provide additional chemical species at the bonding surfaces 8a, 8b that improves the bonding energy during direct bonding. In some embodiments, the activation and termination are provided in the same step, e.g., a plasma to activate and terminate the surfaces 8a, 8b. In other embodiments, the bonding surface 8a, 8b can be terminated in a separate treatment to provide the additional species for direct bonding. In various embodiments, the terminating species can comprise nitrogen. For example, in some embodiments, the terminating species can comprise a nitrogen-bearing fluid or liquid. In some embodiments, the bonding surfaces 8a, 8b can be exposed to a nitrogen-containing plasma. Further, in some embodiments, the bonding surfaces 8a, 8b can be exposed to fluorine. For example, there may be one or multiple fluorine peaks at or near bonding interface 7 between the first and second elements 2, 3. Thus, in the directly bonded structure 1, the bonding interface 7 between two non-conductive materials (e.g., the bonding layers 5a, 5b) can comprise a very smooth interface with higher nitrogen content and/or fluorine peaks at the bonding interface 7. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive features (e.g., conductive contact pads 4a) of the first element 2 can also be directly bonded to corresponding conductive features (e.g., conductive contact pads 4b) of the second element 3. For example, a hybrid bonding technique can be used to provide conductor-to-conductor direct bonds along the bond interface 7 that includes covalently direct bonded non-conductive-to-non-conductive (e.g., dielectric-to-dielectric) surfaces, prepared as described above. In various embodiments, the conductor-to-conductor (e.g., contact pad 4a to contact pad 4b) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, non-conductive (e.g., dielectric) bonding surfaces 8a, 8b (for example, inorganic dielectric surfaces) can be prepared and directly bonded to one another without an intervening adhesive as explained above. Conductive features (e.g., conductive contact pads 4a, 4b, which may be at least partially surrounded by non-conductive dielectric field regions within the bonding layers 5a, 5b) may also directly bond to one another without an intervening adhesive. In various embodiments, the conductive features can comprise discrete pads at least partially embedded in the non-conductive field regions. In some embodiments, the conductive contact features can comprise exposed contact surfaces of through substrate vias (TSVs). In some embodiments, the respective conductive features (e.g., contact pads 4a, 4b) can be recessed below exterior (e.g., upper) surfaces 5a, 5b (e.g., non-conductive bonding surfaces) of the dielectric field region or non-conductive bonding layers 5a, 5b, for example, recessed by less than 30 nm, less than 20 nm, less than 15 nm, or less than 10 nm, for example, recessed in a range of 2 nm to 20 nm, or in a range of 4 nm to 10 nm. In various embodiments, prior to direct bonding, the recesses in the opposing elements can be sized such that the total gap between opposing contact pads is less than 15 nm, or less than 10 nm. The non-conductive bonding layers 5a, 5b can be directly bonded to one another without an adhesive at room temperature in some embodiments and, subsequently, the bonded structure 1 can be annealed. Upon annealing, the conductive features (e.g., contact pads 4a, 4b) can expand and contact one another to form a metal-to-metal direct bond. Beneficially, the use of Direct Bond Interconnect, or DBI®, techniques commercially available from Adeia of San Jose, CA, can enable high density of conductive features (e.g., pads 4a, 4b) to be connected across the direct bond interface 7 (e.g., small or fine pitches for regular arrays). In some embodiments, the pitch p of the conductive features (e.g., bonding pads 4a, 4b or conductive traces embedded in the bonding surface of one of the bonded elements) may be less than 40 microns or less than 10 microns or even less than 2 microns. For some applications, the ratio of the pitch of the conductive features (e.g. bonding pads 4a, 4b) to one of the dimensions (e.g., a diameter) of the bonding pad is less than 5, or less than 3 and sometimes desirably less than 2. In other applications the width of the conductive traces embedded in the bonding surface of one of the bonded elements may range between 0.3 to 20 microns, e.g., in a range of 0.3 to 3 microns. In various embodiments, the conductive features (e.g., contact pads 4a, 4b and/or traces) can comprise copper, although other metals may be suitable.

Thus, in direct bonding processes, a first element 2 can be directly bonded to a second element 3 without an intervening adhesive. In some arrangements, the first element 2 can comprise a singulated element, such as a singulated integrated device die. In other arrangements, as shown in FIGS. 1A-1B, the first element 2 can comprise a carrier or substrate (e.g., a wafer) that includes a plurality (e.g., tens, hundreds, or more) of device regions that, when singulated, form a plurality of integrated device dies. Similarly, the second element 3 can comprise a singulated element, such as a singulated integrated device die, as shown in FIGS. 1A-1B. In other arrangements, the second element 3 can comprise a carrier or substrate (e.g., a wafer). The embodiments disclosed herein can accordingly apply to wafer-to-wafer, die-to-die, or die-to-wafer bonding processes. In wafer-to-wafer (W2W) processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the singulation process (e.g., saw markings if a saw singulation process is used).

As explained herein, the first and second elements 2, 3 can be directly bonded to one another without an adhesive, which is different from a deposition process. In one application, a width of the first element 2 in the bonded structure is similar to a width of the second element 3. In some other embodiments, a width of the first element 2 in the bonded structure 1 is different from a width of the second element 3. Similarly, the width or area of the larger element in the bonded structure may be at least 10% larger than the width or area of the smaller element. The first and second elements 2, 3 can accordingly comprise non-deposited elements. Further, directly bonded structures 1, unlike deposited layers, can include a defect region along the bond interface 7 in which nanometer-scale voids (nanovoids) are present. The nanovoids may be formed due to activation of the bonding surfaces 8a, 8b (e.g., exposure to a plasma). As explained above, the bond interface 7 can include concentration of materials from the activation and/or last chemical treatment processes. For example, in embodiments that utilize a nitrogen plasma for activation, a nitrogen peak can be formed at the bond interface 7. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace some of the OH groups of a hydrolized (OH-terminated) surface with N—H moieties or species, yielding a nitrogen-terminated surface. In embodiments that utilize an oxygen plasma for activation, an oxygen peak can be formed at the bond interface 7. In some embodiments, the bond interface 7 can comprise silicon oxynitride, silicon oxycarbonitride, or silicon carbonitride. As explained herein, the direct bond can comprise a covalent bond, which is stronger than van Der Waals bonds. The bonding layers 5a, 5b can also comprise polished surfaces that are planarized to a high degree of smoothness.

In various embodiments, the metal-to-metal bonds between the contact pads 4a, 4b can be joined such that copper grains grow into each other across the bond interface 7. In some embodiments, the copper grains grow into each other across the bond interface after annealing the bonded structures or substrates, e.g., at temperatures between 5° and 400° C. or at temperatures between 80 and 300 C. In some embodiments, the copper can have grains oriented along the 111 crystal plane for improved copper diffusion across the bond interface 7. The bond interface 7 can extend substantially entirely to at least a portion of the bonded conductive features (e.g., bonded contact pads 4a, 4b), such that there is substantially no gap between the non-conductive bonding layers 5a, 5b at or near the bonded conductive features. In some embodiments, a barrier layer may be provided under the conductive features (e.g., which may include copper). In other embodiments, however, there may be no barrier layer under the conductive features, for example, as described in U.S. Pat. No. 11,195,748, which is incorporated by reference herein in its entirety and for all purposes.

Beneficially, the use of the hybrid bonding techniques described herein can enable extremely fine pitch between adjacent contact pads 4a or 4b, and/or small pad sizes. For example, in various embodiments, the pitch p (see FIG. 1A), i.e., the distance from edge-to-edge or center-to-center between adjacent conductive features (e.g., between adjacent contact pads 4a or adjacent contact pads 4b) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

In various embodiments, the second element 3 can comprise a singulated device die, and the first element 2 can comprise a wafer. In other embodiments, both elements 2, 3 can comprise a singulated device die. In such an embodiment, the second element 3 may be initially provided in wafer form or larger substrate and singulated to form the singulated first element 3. However, the singulation process and/or other processing steps may produce debris that can contaminate the planar bonding surface, which can leave voids and/or defects when two elements are bonded. Accordingly, prior to singulation, a protective layer can be provided over the bonding surface before activation and direct bonding in order to prevent debris from contaminating the bonding surface. The protective layer can comprise an organic or inorganic layer (e.g., a photoresist) that is deposited (e.g., spin coated onto) the bonding surface. Additional details of the protective layer may be found throughout U.S. Pat. No. 10,714,449, the entire contents of which are incorporated by reference herein in their entirety and for all purposes. The wafer containing the first element can be singulated using any suitable method. The protective layer over the bonding surface can beneficially protect the bonding surface from debris. Before direct bonding, the protective layer can be removed from the bonding surface with a cleaning agent, for example with a suitable solvent, such as an alkaline solution or other suitable cleaning agent as recommended by the supplier of the protective layer. The protective layer cleaning agent can be selected such that it does not substantially roughen the smooth bonding surface of the bonding layer and does not substantially etch or contaminate the metal of the contact pad to increase the recess of the pad metal after subsequent cleaning operations. An excessive pad recess may form a recess that is too deep, which may prevent (or reduce the strength of) pad-to-pad bonding at the appropriate annealing conditions (e.g., annealing temperature and times). The cleaning agent can be applied by a fan spray of the liquid cleaning agent or other known methods. For example, the cleaned bonding surface can be ashed (e.g., using an oxygen plasma) and cleaned with deionized water (DIW). In some embodiments, the cleaned element can be activated before direct bonding.

In some arrangements, one or both semiconductor elements (e.g., dies or substrates, such as wafers) may be subject to warping. For example, the semiconductor element(s) may be thinned, which can increase the warpage of the semiconductor element(s), particularly during high temperature processing. In various applications, for example, the semiconductor elements can be thinned to a thickness of less than 150 microns, less than 100 microns, less than 8 microns, less than 50 microns or less than 20 microns. The thinned elements may become warped because of various unrelieved stresses that the elements contain due to previous processing steps. These stresses may originate from various dielectric coating processes, the metallization step, the thinning operations, mismatch or large variation in the coefficient of thermal expansion (CTE), and the thickness of the various layers formed into the elements. For example, the dielectric layer 5a and 5b (for example, having thickness in the range of 0.3 to 5 microns) (with a CTE in the range of 0.3 to 10 ppm $K^{-1}$, e.g., a CTE of ~0.5 ppm $K^{-1}$) may be coated, e.g., may be coated at temperature ranging from 150 to 350° C. (or in a range of 180° C. to 350° C.) on the substrate 6a or 6b (with a CTE in the range of 2 to 10 ppm $K^{-1}$ e.g., a CTE of ~2.5 ppm $K^{-1}$). The coated dielectric layer 5a or 5b may induce a compressive stress in the range of 200 to 600 MPa on the substrate 6a. The conductive layer or the pad 4a or 4b, for example copper (with a CTE in the range of 10 to 25 ppm $K^{-1}$, e.g., a CTE of ~17 ppm $K^{-1}$) (for example, having a thickness of 0.3 to 5 micron) may be electroplated, e.g., electroplated at a temperature in a range of 15 to 35° C. The induced coating stress from the coated conductive pad may be tensile or compressive, depending on the plating process. The thermal annealing of the plated conductive layer 4a or 5b to stabilize the grain size of the pad before the metal planarization step may occur between 80 to 300° C. Upon cooling to room temperature, the thermal annealing processing may induce a tensile stress on the substrate 6a or 6b. The planarization process to remove the unwanted conductive layer to form smooth bonding surfaces can significantly reduce the tensile stress on the substrate. Thinning the thick substrate 6a or 6b from the backside, for example from nominally 750 microns to less than 100 microns or to less than 50 microns, induces further distortion to the thinned substrate 6a or 6b.

Directly bonding elements that are warped may cause inadequate electrical contact between opposing conductive contacts, and/or may cause voids in the bonded structure. Various embodiments disclosed herein utilize a microwave annealing process to densify features such as the dielectric bonding layer of one or both semiconductor elements and/or deposited metal features. The microwave annealing process can serve to balance stresses on major surfaces of the element(s). The densified dielectric bonding layers can be more stoichiometric as compared to dielectric bonding layers that are not exposed to a microwave anneal process. Further, the use of microwave annealing can accomplish densification at much lower temperatures compared to conventional densification anneal, since the microwave annealing can be performed instead of a thermal anneal using a furnace or oven.

Figure 2:
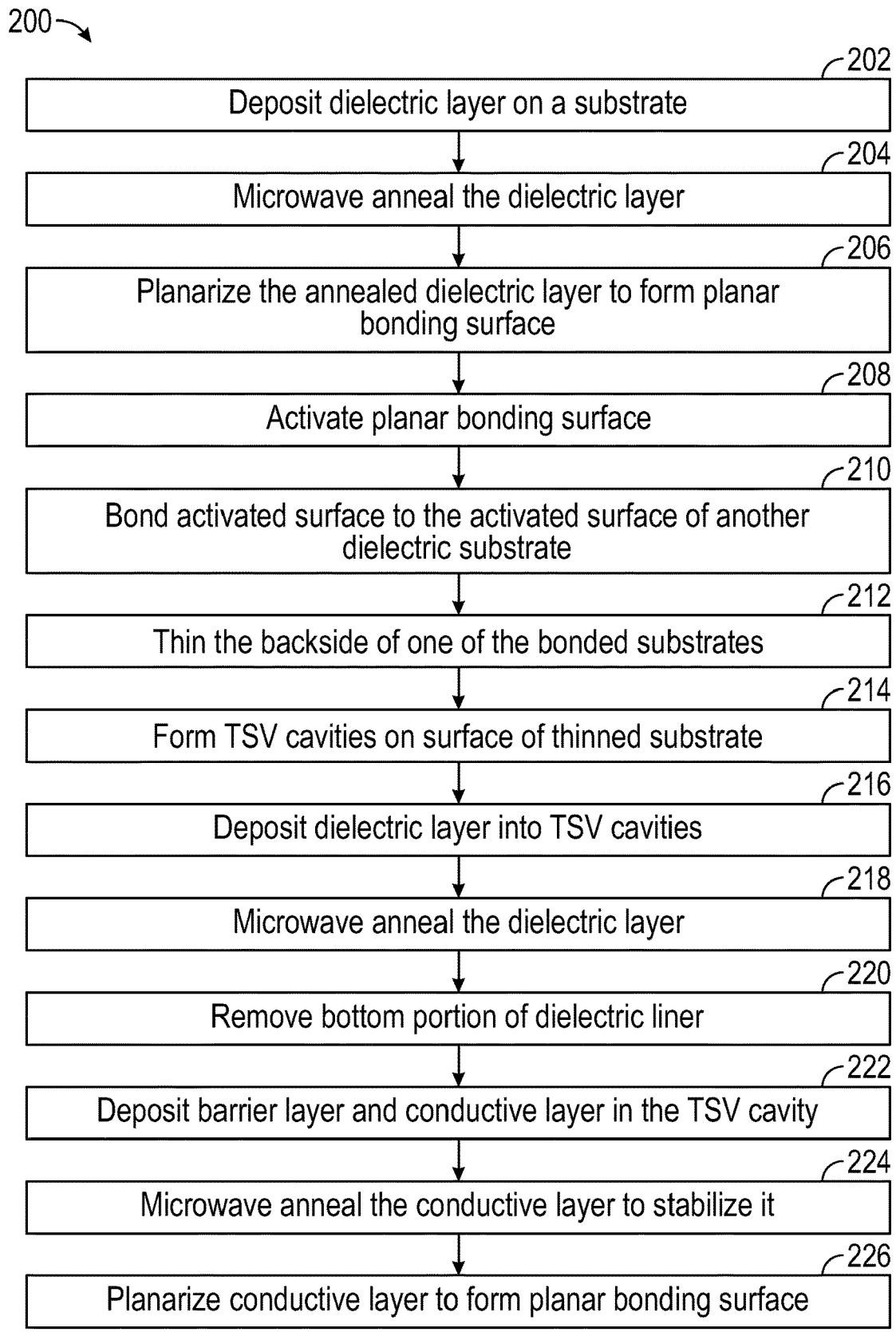
FIG. 2 is a flowchart illustrate a wafer-to-wafer (W2W) process for reducing wafer warpage, increasing material densification, and improving device yield, according to some embodiments.
Figure 3A:
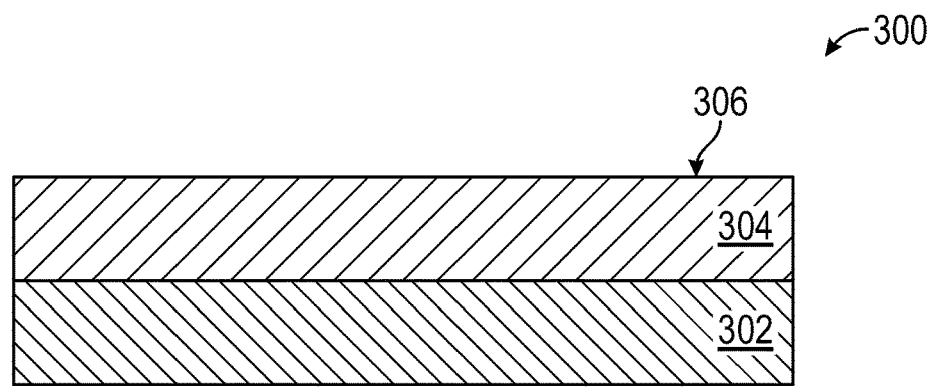
FIGS. 3A-3F are schematic side sectional views of semiconductor elements at various steps of the W2W process shown in FIG. 2.

FIG. 2 is a flowchart illustrating a wafer-to-wafer (W2W) process 200 for reducing wafer warpage, increasing material densification and improving device yield. FIGS. 3A-3F are schematic side sectional views of semiconductor elements 300, 310 at various steps of the W2W process 200 shown in FIG. 2. In the illustrated example, connection can be provided in a via last process, such that the bonding can be between dielectric materials only. As shown in FIG. 3A, at step 202, a dielectric bonding layer 304 is deposited on a substrate 302. In some embodiments, the dielectric bonding layer 304 is plasma deposited on the substrate 302 at a first temperature $T_1$, where the first temperature $T_1$ can be in a range of 30° C. to 200° C., in a range of 150° C. to 350° C., in a range of 150° C. to 200° C., in a range of 150° C. to 170° C., or less than 170° C. In some embodiments, the dielectric bonding layer 304 is plasma deposited by plasma enhanced chemical vapor deposition (PECVD). In some embodiments, the dielectric bonding layer is deposited using atomic layer deposition (ALD) or plasma-enhanced ALD.

At step 204, the semiconductor element 300 is microwave annealed to densify the dielectric bonding layer 304. In some embodiments, the semiconductor element 300 can be microwave annealed at a second temperature $T_2$ that is lower than the first temperature $T_1$. For example, in some embodiments, the second temperature $T_2$ is in a range of −25° C. to 150° C., in a range of 20° C. to 175° C., in a range of 25° C. to 160° C., or in a range of 20° C. to 150° C. In some embodiments, the warpage of the element 300 can be measured, and, based on the measurement, the microwave anneal parameters (e.g., temperature, etc.) may be selected to as to reduce the warpage. In some embodiments, the microwave annealing step can be performed while also thermally heating the semiconductor element 300 or substrate 302, e.g., in a furnace or oven. In other embodiments, the microwave annealing step may be performed without a separate heat source or in vacuum. The microwave annealing step can be performed using any suitable system. One example of a microwave applicator may be found throughout U.S. Patent Publication No. US 2016/0227612, the entire contents of which are incorporated by reference herein in their entirety and for all purposes.

At step 206, the densified dielectric layer 304 can be planarized to form a planar bonding surface 306 and, in some embodiments, at step 208, the planarized bonding surface 306 can be activated for direct bonding, as explained above.

Figure 3B:
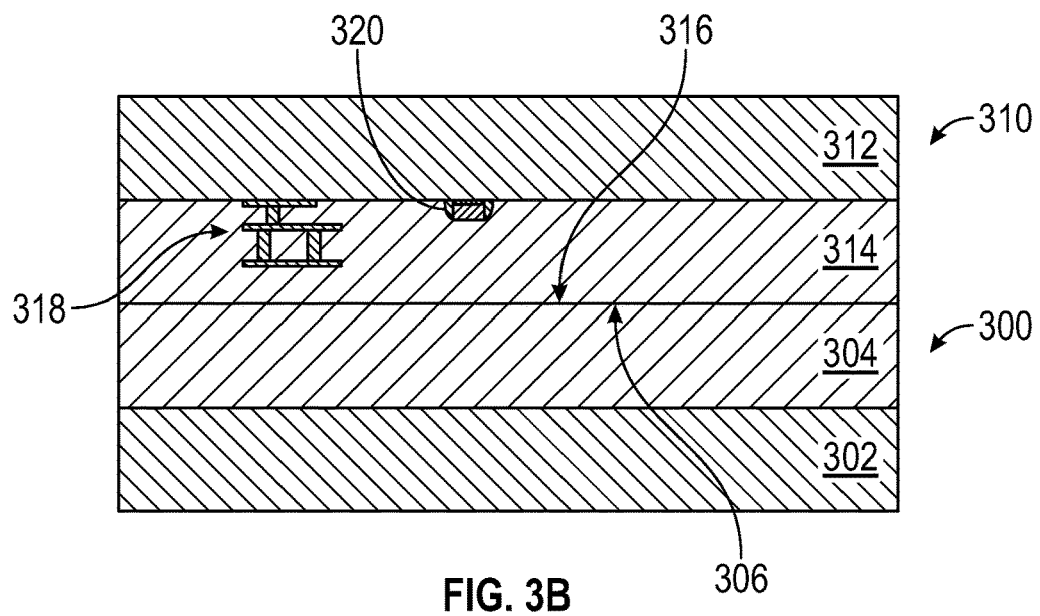

As shown in FIG. 3B, at step 210, the first semiconductor element 300 on which the dielectric bonding layer 304 is disposed is directly bonded to a second semiconductor element 310 without an intervening adhesive. The second semiconductor element 310 comprises a substrate 312 and a dielectric bonding layer 314 having a planar bonding surface 316. In some embodiments, the first semiconductor element 300 is bonded to the second semiconductor element 310 without an intervening adhesive by directly bonding the planarized bonding surface 306 to the second bonding surface 316 on the dielectric bonding layer 314. In the illustrated embodiment, the second semiconductor element 310 includes various electrical components formed within the dielectric bonding layer 314, including a conductive metallization structure 318 and a transistor 320, while the first semiconductor component 300 does not include any electrical components formed in the dielectric bonding layer 304. However, this is only an example. In other embodiments, the first semiconductor component 300 can have electrical components formed within the dielectric bonding layer 304 while the second semiconductor component 310 does not have electrical components formed within the dielectric bonding layer 314. In still other embodiments, both semiconductor elements 300, 310 include electrical components formed within their respective dielectric layers 304, 314. For example, in some embodiments, the first and second semiconductor elements 300, 310 can include bond pads, electrodes, through silicon vias (TSV), metal interconnect layers, and/or active circuitry formed within and/or through the dielectric layers 304, 314.

In the illustrated embodiment, the second semiconductor element 310 is bonded to the planarized bonding surface 306 of the first semiconductor element 300 and no other elements are bonded to the planarized bonding surface 306. In other embodiments, however, additional elements may be directly bonded to the planar bonding surface of the first semiconductor element 300 (not shown). The additional bonded elements may have thru-element electrode or electrodes (for example thru-silicon via TSV) for electrical interconnection to conductive layers or pads between the bonded elements. The warpage of some of the additional bonded element may have been corrected by the microwave treatment methods.

Figure 3C:
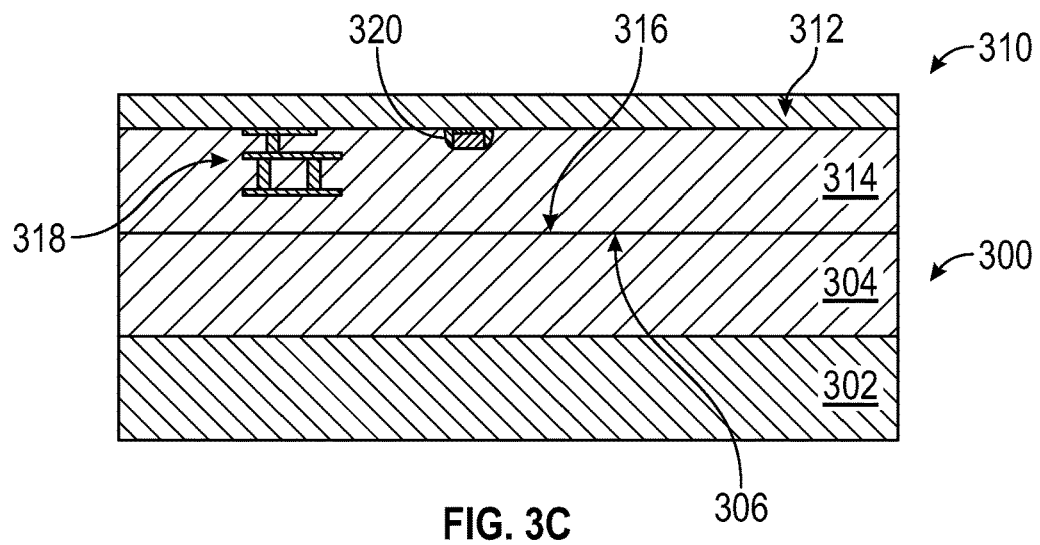

As shown in FIG. 3C, at step 212, the back side of the substrate 312 for the second semiconductor element 310 is thinned. The substrate 312 can be thinned such that it has a thickness that is less than 250 microns, less than 50 microns, less than 20 microns, less than 10 microns, less than 5 microns, or a value in a range defined by any of these values. In the illustrated embodiment, the substrate 312 for the second semiconductor element 310 is thinned while the substrate 302 for the first semiconductor element 300 is not thinned. In other embodiments, however, the substrate 302 for the first semiconductor element 300 is thinned while the substrate 312 for the second semiconductor element 310 is not thinned. In still other elements, both substrates 302, 312 can be thinned.

Figure 3D:
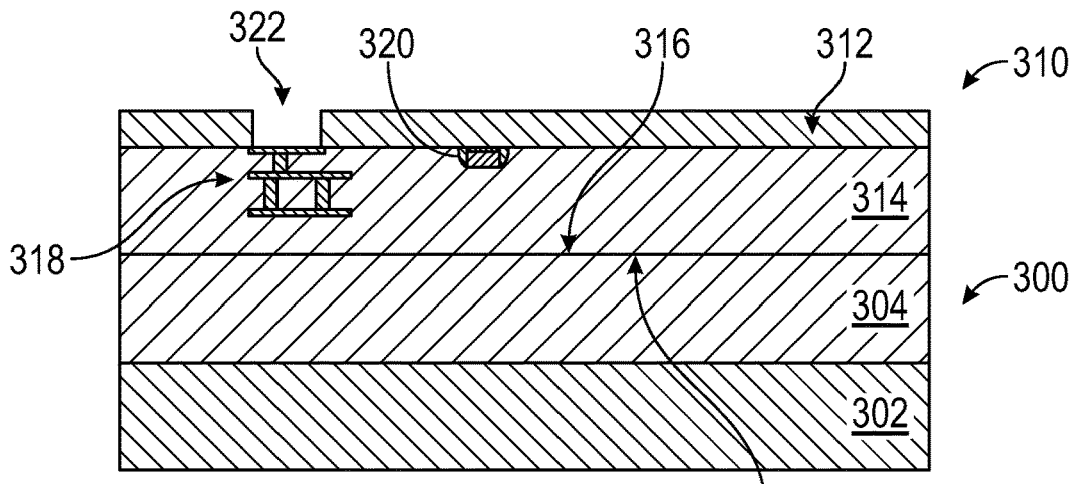

As shown in FIG. 3D, at step 214, a cavity 322 for a through substrate via (TSV) is formed in a surface of the thinned substrate 310 in a via last process. In the illustrated embodiment, only a single cavity 322 is formed in the thinned substrate 312. In other embodiments, however, multiple cavities 322 can be formed in the thinned substrate 310.

Figure 3E:
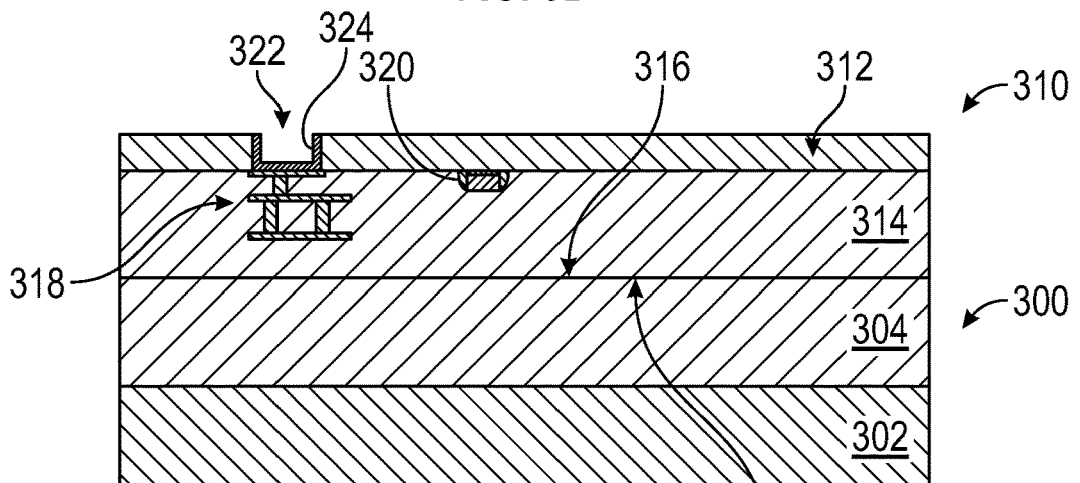

As shown in FIG. 3E, at step 216, a dielectric liner 324 is formed in the cavity 322 by depositing a dielectric material in the cavity 322 at a temperature $T_3$. The thickness of the dielectric liner, which may depend on the diameter of the cavity 322, may be less than 500 nm, less than 200 nm, less than 100 nm, less than 50 nm, or a value in a range defined by any of these values. In general, the thinner the dielectric liner 324, the smaller the stress induced by the dielectric liner 324. In the illustrated embodiment, only a single dielectric liner 324 is formed in the cavity 322. In other embodiments, multiple dielectric liners may be formed in the cavity 322. In these embodiments, the multiple dielectric liners can be selectively formed such that the dielectric liners alternate between having compressive stress and tensile stress so as to reduce total stress on the on the semiconductor element. In still other embodiments, however, a dielectric liner is not needed. In these embodiments, step 216 may be omitted.

At step 218, the dielectric liner 324 is microwave annealed to densify the dielectric liner 324 at a temperature $T_4$ that is lower than the temperature $T_3$ at which the dielectric liner 324 is formed.

At step 220, the portion of the dielectric liner 324 at the bottom of the TSV cavity 322 can be selectively removed to expose a conductive layer beneath. In the illustrated embodiment, cavity 322 is formed over the metallization structure 318 such that selectively removing the portion of the dielectric liner 324 at the bottom of the TSV cavity 322 exposes a portion of the metallization structure 318. In other embodiments, however, the cavity 322 can be formed over a different conductive component such that removing the portion of the dielectric liner 324 at the bottom of the TSV cavity 322 exposes the other conductive component. For example, in some embodiments, the cavity 322 is formed over the transistor 320 such that removing the bottom portion of the dielectric liner exposes the transistor 320.

Figure 3F:
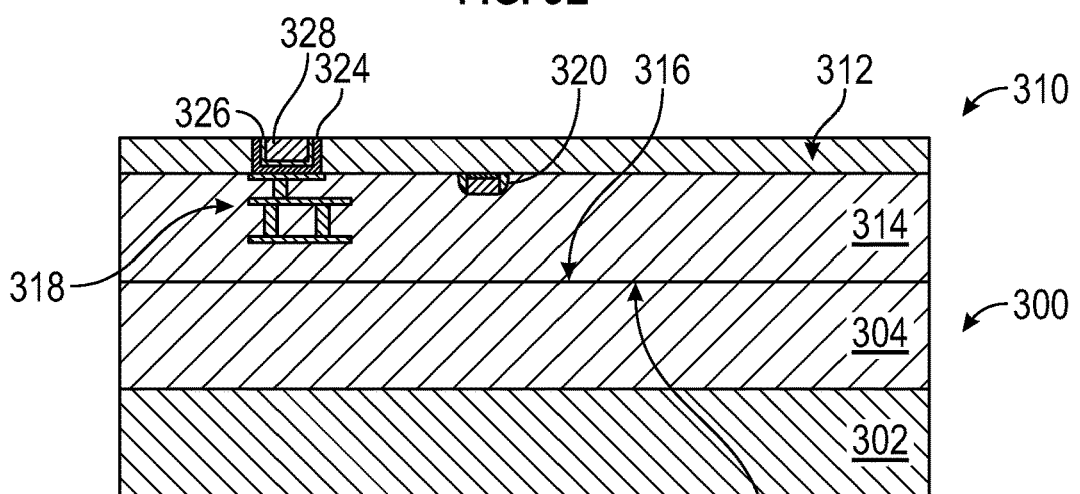

As shown in FIG. 3F, at step 222, a barrier (or adhesive) layer 326 and a conductive layer 328 (e.g., a copper layer) can be provided in the TSV cavity 322 and over coat the TSV cavity 322. In some embodiments, the conductive layer 328 is formed by electrolytic or electroless methods. In other embodiments, the conductive layer 328 is formed by physical vapor deposition (PVD) or by 3D printing.

At step 224, the conductive layer 328 is microwave annealed to stabilize the conductive layer 328. In some embodiments, the conductive layer 328 is microwave annealed at a temperature $T_5$ that is less than the temperature $T_3$ at which the dielectric liner 324 is formed.

At step 226, the back surface of the thinned substrate 312 can be planarized to remove excess conductive metal (e.g., copper) and other unwanted materials from the back surface of the thinned substrate 312 and form a planar bonding surface. After planarizing the back surface of the thinned substrate 312, other suitable subsequent process may be performed over the TSV last interconnect electrode.

Figure 4:
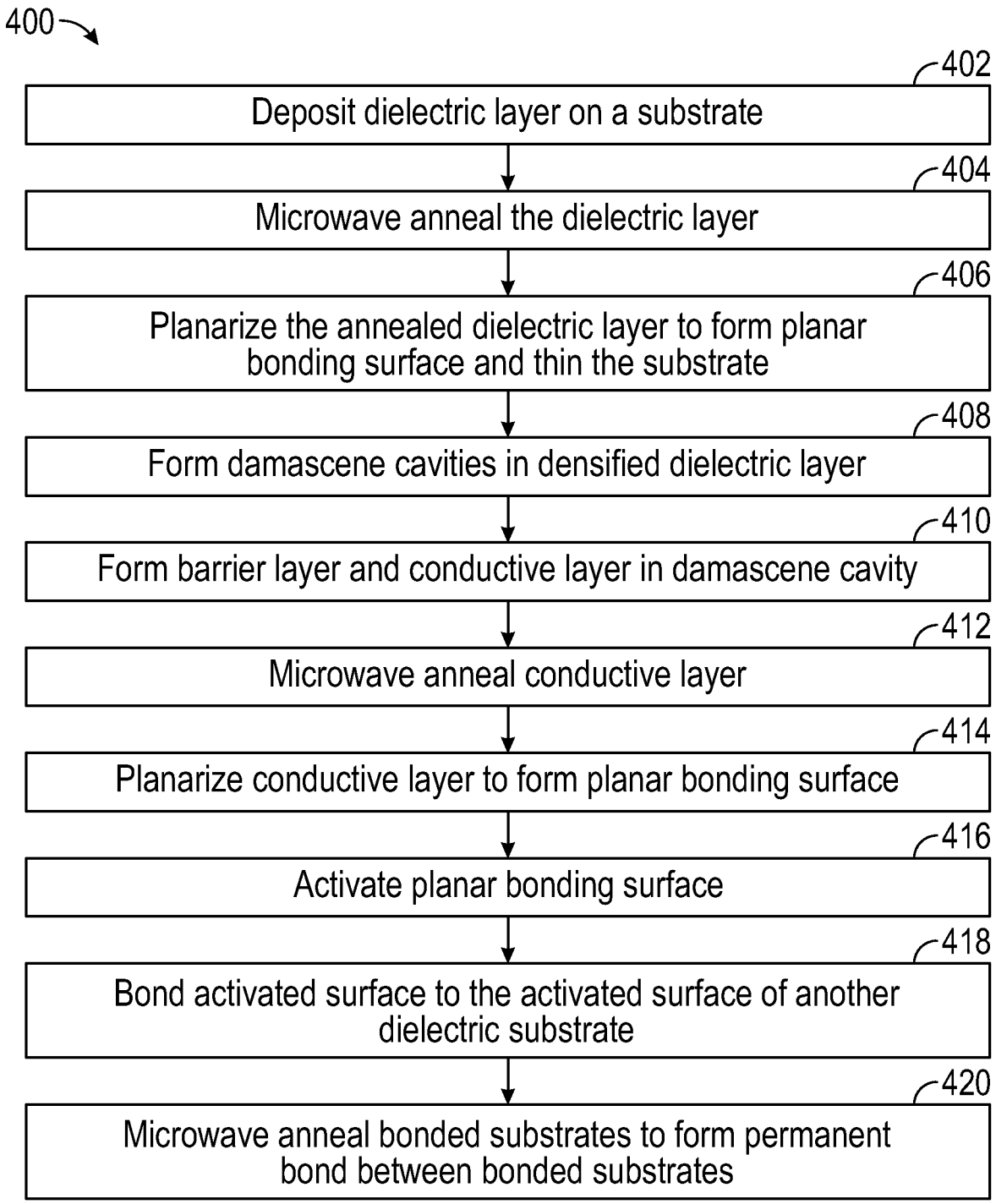
FIG. 4 is a flowchart illustrating another W2W process for reducing wafer warpage and improving device yield, according to embodiments.

FIG. 4 is a flowchart illustrating an alternative W2W process 400 for reducing wafer warpage and improving device yield, according to embodiments employing direct hybrid bonding of both conductive and non-conductive materials. FIGS. 5A-5E are schematic side sectional views of semiconductor elements 500, 520 at various steps of the W2W process 200 shown in FIG. 4. Unless otherwise noted, features or steps of FIG. 4 may be the same as or generally similar to features or steps of FIG. 2.

Figure 5A:
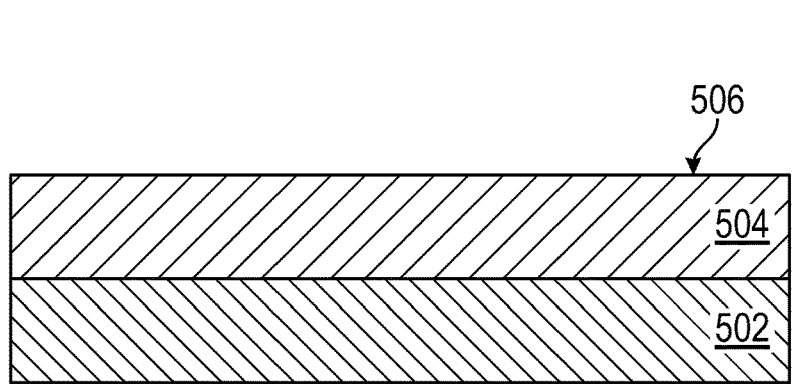
FIGS. 5A-5E are schematic side sectional views of semiconductor elements at various steps of the W2W process shown in FIG. 4.

As shown in FIG. 5A, at step 402, a dielectric bonding layer 504 is deposited on a substrate 502.

At step 404, the semiconductor element 500 is microwave annealed to densify the dielectric bonding layer 504.

At step 406, the densified dielectric bonding layer 504 is planarized to form a planar bonding surface 506 and the substrate 502 is thinned. As described above in connection with FIG. 3C, the backside of the substrate 502 can be thinned such that the substrate 502 has a thickness that is less than 250 microns, less than 50 microns, less than 20 microns, less than 10 microns, less than 5 microns, or a value in a range defined by any of these values.

Figure 5B:
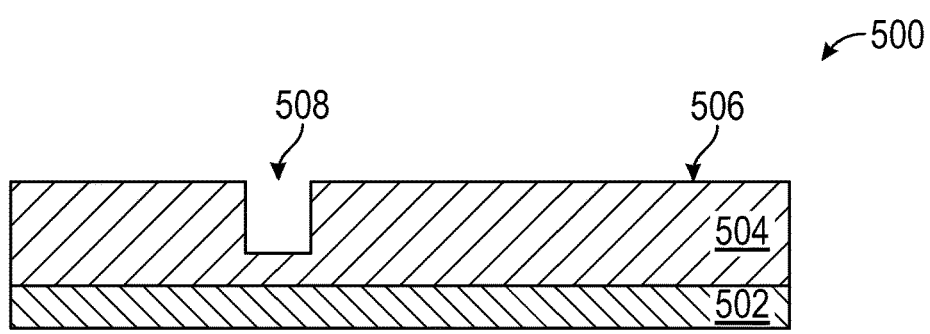

As shown in FIG. 5B, at step 408, after planarizing the densified dielectric bonding layer 504, one or more damascene cavities 508 are formed in the dielectric bonding layer 504. The one or more damascene cavities 508 can be formed by any suitable method and can be formed such that the cavities 508 do not extend completely through the dielectric bonding layer 504. In the illustrated embodiment, only a single damascene cavity 508 is formed in the dielectric bonding layer 504. In other embodiments, however, multiple damascene cavities 508 can be formed within the dielectric bonding layer 504.

Figure 5C:
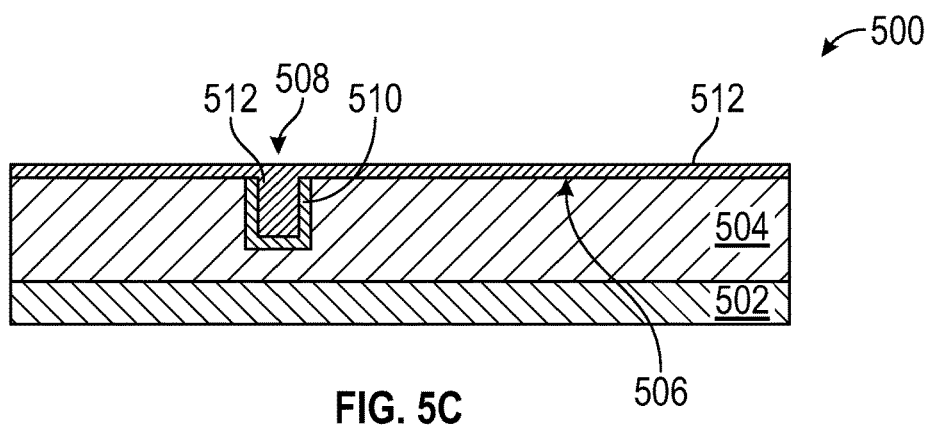

As shown in FIG. 5C, at step 410, a barrier layer 510 and a conductive layer 512 (e.g., a copper layer) can be provided in the cavity 508. The barrier layer 510 can be positioned between the conductive layer 512 and the dielectric layer 504 within the cavity 508. In some embodiments, the conductive layer 512 can be deposited using electrolytic or electroless methods. In other embodiments, the conductive layer 512 can be deposited using PVD methods, including ALD methods. During the conductive layer 512 deposition process, some of the conductive material can be deposited on the bonding surface 506 such that at least a portion of the bonding surface 506 is covered by the conductive layer 512.

At step 412, conductive layer 512 can be at least partially densified by microwave annealing the metal that forms the conductive layer 512. In some embodiments, the conductive layer 512 can be microwave annealed at a temperature lower than a furnace anneal temperature. For example, while furnace annealing can typically occur at a temperature of 120° C. to 250° C., the conductive layer 512 can be microwave annealed at a temperature below 100° C. or below 80° C. In other embodiments, the microwave metal annealing can be omitted in favor of a conventional thermal anneal.

Figure 5D:
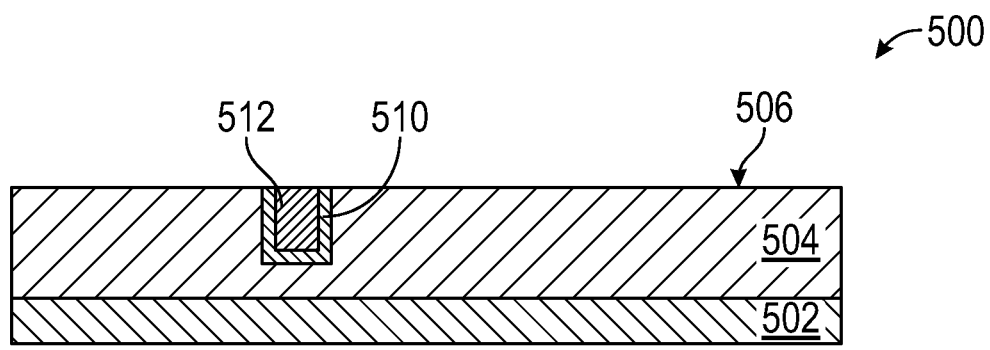

As shown in FIG. 5D, at step 414, the front side of the semiconductor element 500 can be planarized to remove the portions of the conductive layer 512 deposited on the bonding surface 506 to reveal the bonding surface 506.

At step 416, the planar bonding surface 506 is activated.

Figure 5E:
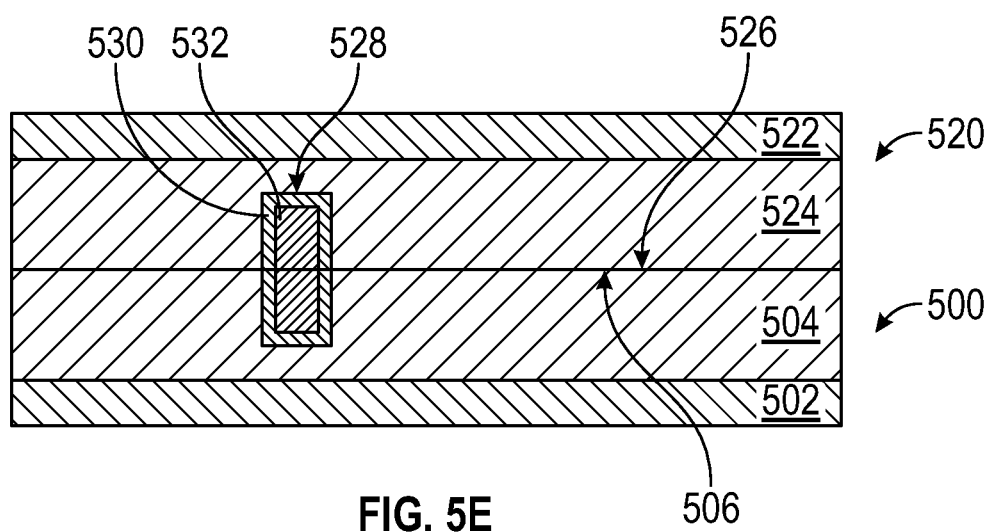

As shown in FIG. 5E, at step 418, the first semiconductor element 500 is directly hybrid bonded to a second semiconductor element 520 without an intervening adhesive. The second semiconductor element 520 includes a substrate 522, a dielectric bonding layer 524 that forms a bonding surface 526, and a bond pad formed from a conductive layer 532 and barrier layer 530 deposited within a cavity 528.

At step 420, an additional microwave anneal can be performed after bonding the second semiconductor element 520 to the first semiconductor element 500 to increase a bond strength between the bonded elements 500, 520. In some embodiments, the bonded structure can be microwave annealed at a temperature lower than furnace temperatures. For example, while furnace anneal temperatures may range between 20° and 350° C., microwave anneal may be performed below 200° C., below 180° C., below 150° C., or below 120° C. Microwave annealing comprises exposing the dielectric bonding layer to one or a plurality of frequencies in a range of 1000 Mhz to 100 GHz, for example, in a range of 2 GHz to 15 GHz. The microwave energy may induce confined eddy current heating between the metal pad recess between the opposing bonded elements. The heating rate in the microwave oven may range between 1 to 500° C. per minute and typically between 10 to 200° C. per min, depending on the determined heating rate for the bonded substrates of interest. Bonding substrates with large CTE differences may utilize a reduced heating rate and bonding may be performed at a lower temperature compared to substrates having similar CTEs.

In hybrid bonding processes, the bonded structure can be annealed to expand recessed contacts in some embodiments to form electrical connections between opposing contacts. Testing has shown that microwave annealing recessed contacts in direct bonding applications allows for the formation of satisfactory electrical connections between opposing contacts at lower temperatures for shorter periods of time than in conventional thermal annealing processes. To show the effectiveness of microwave annealing over conventional thermal annealing processes, several tests were performed in which bonded structures having unannealed opposing contacts were annealed using either microwave annealing processes or thermal annealing processes. The contacts were formed from copper and several different microstructures of copper were tested, including standard copper, nanotwinned copper, and fine-grained copper. These tests showed that microwave annealing the copper contacts at a temperature of 165° C. for 2 hours was sufficient to establish a sufficient electrical contact between the contacts. The tests also showed that even better electrical contact could be achieved by microwave annealing the copper contacts at a temperature of 180° C. for just 30 minutes and that microwave annealing the contacts at 180° C. for an hour improved the electrical contact even more. In contrast, annealing the copper contacts in a conventional oven at a temperature of 180° C. for 1 hour was insufficient to establish an electrical connection between the copper contacts. The tests also showed that, while annealing the contacts in a conventional oven at a temperature of 200° C. for 1 hour was sufficient to establish a satisfactory electrical connection, the electrical connection was generally worse (or only marginally better) than the samples that had been microwave annealed at 180° C. for just 30 minutes. Only the samples that had been annealed in a conventional oven at 225° C. for 1 hour had an electrical connection that was comparable to the electrical connection for the samples that were microwave annealed at 180° C. for one hour. Additionally, a scanning electron microscope (SEM) analysis of the cross-sections of the annealed samples showed that the grain structures of the samples annealed using microwave annealing were generally similar to the grain structures for the samples that were thermally annealed. These results indicate that microwave annealing the electrical connections in direct bonding applications can allow for a greater than 30° C. reduction (and potentially even a greater than 40° C. reduction) in annealing temperature requirements.

Figure 6A:
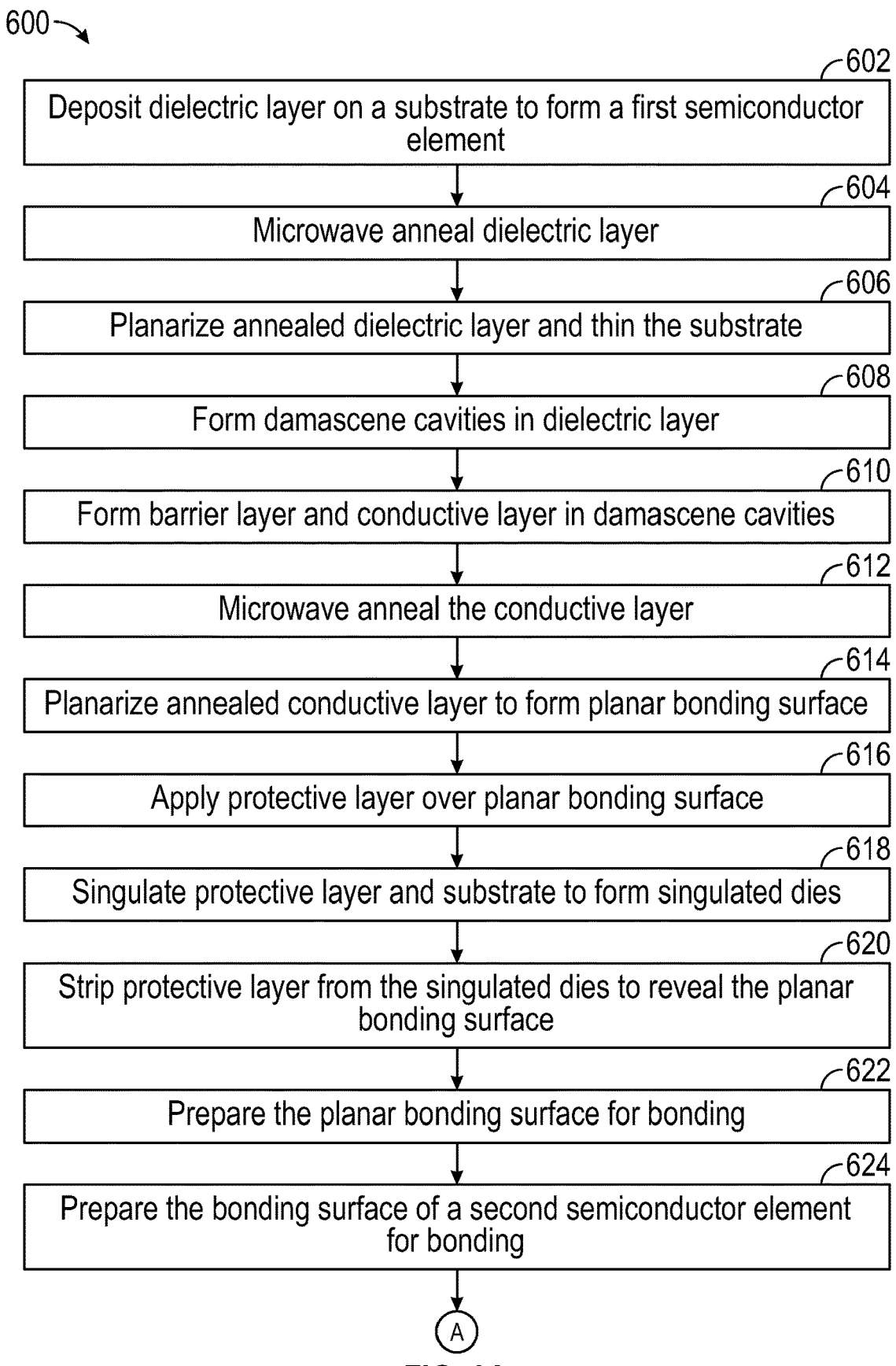
FIGS. 6A and 6B are a flowchart illustrating a die-to-wafer (D2W) process for reducing die warpage and improving device yield, according to embodiments.
Figure 6B:
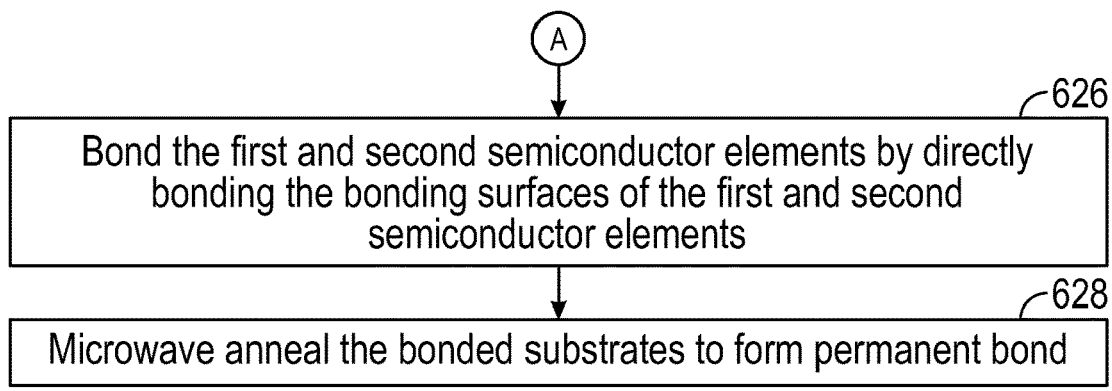

FIGS. 6A and 6B are a flowchart illustrating a die-to-wafer (D2W) process 600 for reducing die warpage and improving device yield, according to another embodiment employing direct hybrid bonding of both conductive and non-conductive materials. Unless otherwise noted, features or steps of FIGS. 6A and 6B may be the same as or generally similar to features or steps of FIG. 4. Specifically, steps 602-614 of D2W process 600 may be generally similar to steps 402-414 of W2W process 400. However, unlike the W2W process 400 of FIG. 4, at step 616 of process 600, after planarizing to form the bonding surface and thinning the substrate from the backside, the bonding surface is disposed face up on a dicing sheet for singulation and a protective layer (e.g., a protective organic layer, such as a photoresist) is provided over the planar bonding surface.

At step 618, the protective layer and the semiconductor element in wafer form are singulated to form a plurality of semiconductor elements in singulated die form.

In the illustrated embodiment, the substrate of the first semiconductor element is thinned after planarizing the dielectric layer but before applying the protective coating. In other embodiments, however, the substrate is thinned at another step in the process. For example, in some embodiments, the substrate is thinned after applying the protective coating.

At step 620, the protective layer can be stripped or removed from the bonding surface of the singulated dies or substrates.

At steps 622 and 624, the bonding surface of at least one of singulated dies and the bonding surface of a second semiconductor element (e.g., a wafer or another die) can be prepared for direct bonding. In some embodiments, the bonding surfaces can be activated before or after applying the protective coating.

At step 626, the singulated die can be directly bonded to the second semiconductor element without an adhesive. Multiple arrays of singulated die or first semiconductor elements can be bonded to the larger second semiconductor element at determined pitches to allow for device testing and singulation of the second element.

At step 628, the assembled first and second semiconductor elements are microwave annealed to increase the strength of the bond between the first and second semiconductor elements and form a permanent bond. As described elsewhere in the application, the assembled first and second semiconductor elements can be microwave annealed at a temperature lower than furnace annealing temperature.

Additional singulated elements comprising TSV electrodes may be bonded on the backside of the first bonded element or arrays of bonded element. In one embodiment, a stack of more than four (4) elements having TSV electrodes can be bonded over the second element. Also, additional third elements smaller than a first element (for example a chiplet) in a lateral dimension may be directly bonded to the second element laterally to the first element. The second element with the various attached elements are bonded at a temperature lower than furnace bonding temperature as described earlier.

Figure 7:
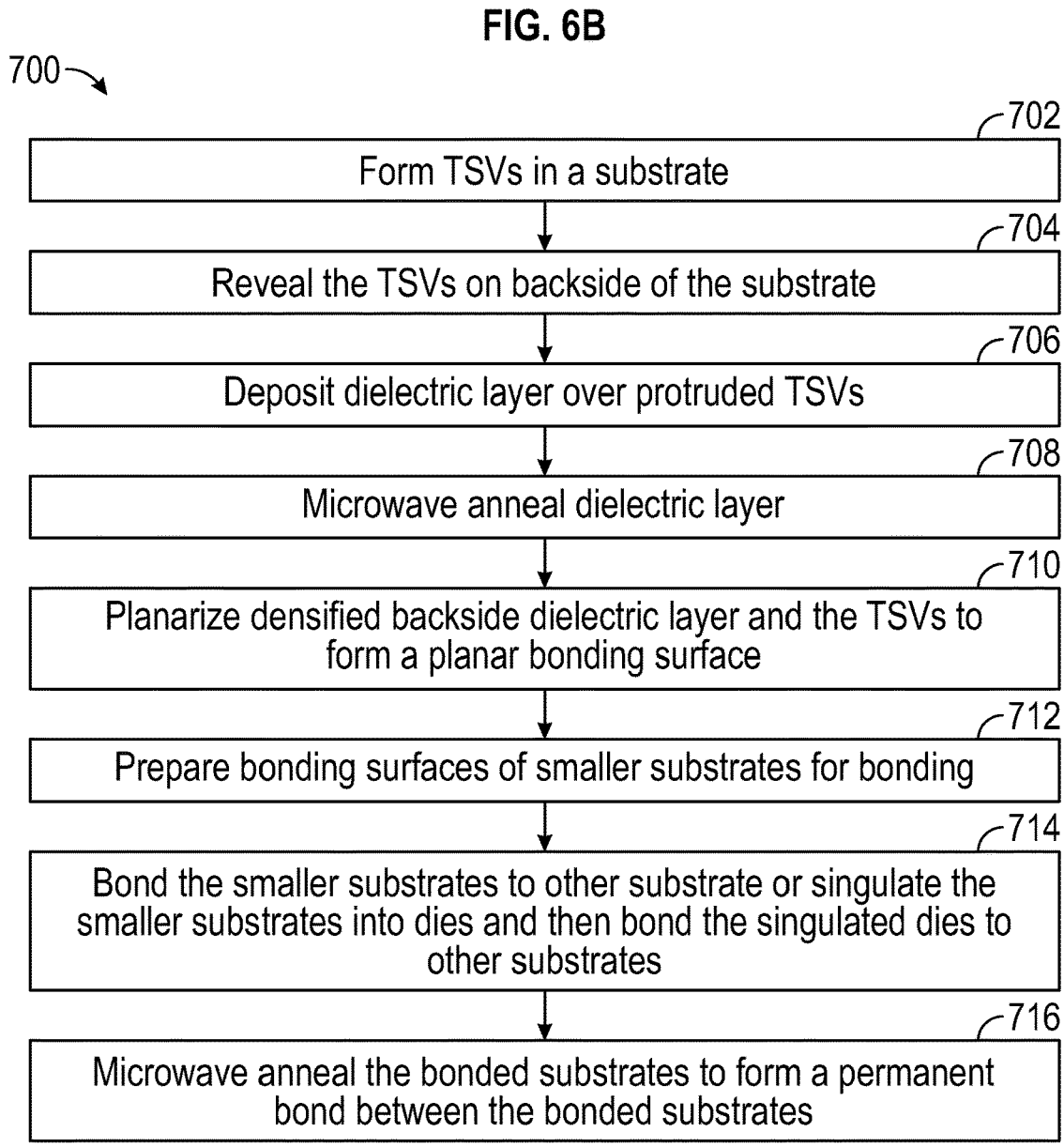
FIG. 7 is a flowchart illustrating a process for reducing die warpage in a TSV reveal process, according to embodiments.
Figure 8A:
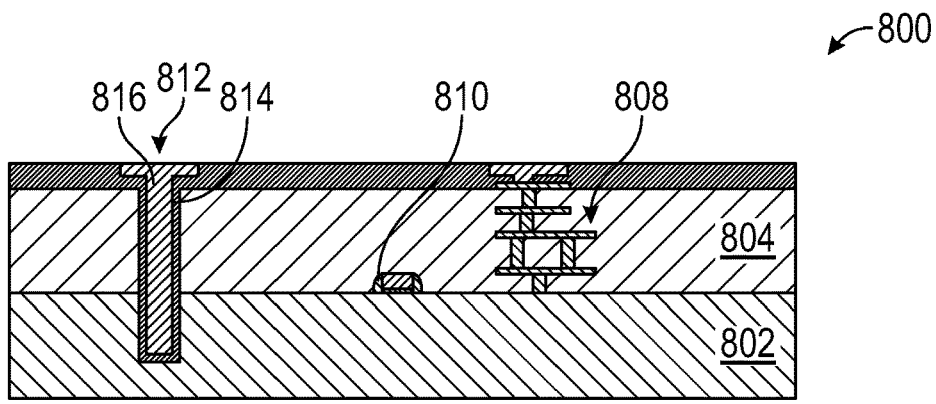
FIGS. 8A-8C are schematic side sectional views of a semiconductor element at various stages of the TSV reveal process shown in FIG. 7.
Figure 8B:
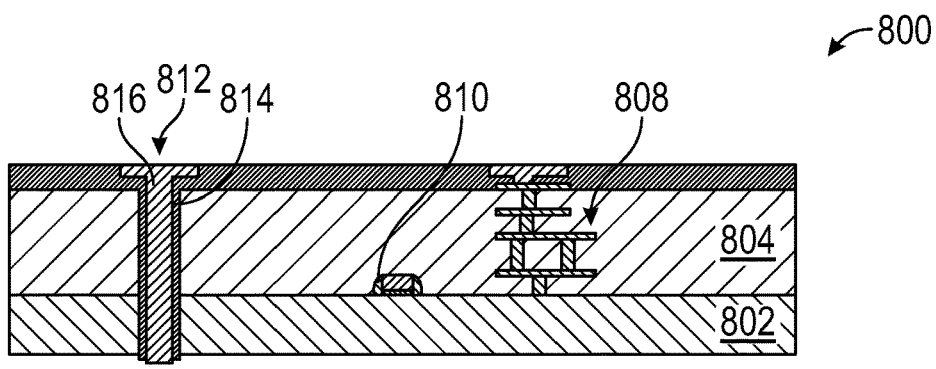
Figure 8C:
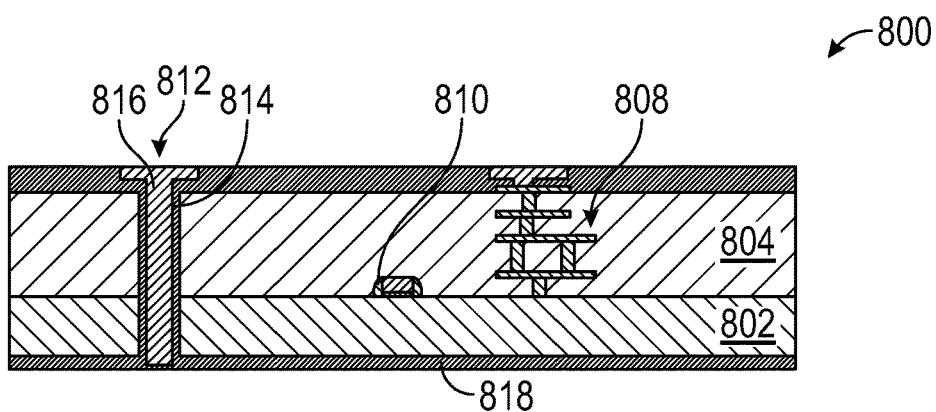

FIG. 7 is a flowchart illustrating a process 700 for reducing die warpage in a TSV reveal process, according to another embodiment. FIGS. 8A-8C are schematic side sectional views of the semiconductor element 800 at various stages of the TSV reveal process. Unless otherwise noted, the steps shown in FIG. 7 may be the same as or generally similar to steps described above in connection with FIGS. 2, 4, 6A, and 6B and features shown in FIGS. 8A-8C may be the same or generally similar to the features describe above in connection with FIGS. 3A-3F and 5A-5E. The semiconductor element 800 includes a substrate 802, a dielectric layer 804 formed on the substrate 802, and various electrical components formed within the dielectric layer 804, including a metallization structure 808 and a transistor 810.

As shown in FIG. 8A, at step 702, a TSV (or Thru glass via (TGV) or Thru substrate electrode (TSE)) 812 is formed in the semiconductor element 800. The TSV 812 extends through the dielectric layer 804 and into the substrate 802 and includes a dielectric barrier layer 814 and a conductive layer 816.

As shown in FIG. 8B, at step 704, the substrate 802 is thinned to reveal the TSV 812 such that the TSV 812 protrudes from a back side of the semiconductor element 800. The thinning operation may comprise initially grinding off the bulk of the backside of the substrate 802, polishing the backside 802 to a desired thickness to relief the stresses and cracks from the grinding operation, and then selectively removing the portion of the backside of the substrate 802 by, for example, reactive ion etching (RIE) methods to form protruding dielectric coated vias. For this process, the semiconductor element 800 can be temporarily adhered to a carrier with an adhesive in order to support the semiconductor element 800 for further processing steps. The adhesive may comprise an organic adhesive that is sensitive to high temperatures or optical radiation of known wavelength and intensity, such that it can be important to use a low thermal budget for depositing and/or processing the backside dielectric layer.

As shown in FIG. 8C, at step 706, a backside low temperature dielectric (LTD) layer 818 is formed on the backside of the semiconductor element 800 and the exposed TSV 812. In some embodiments, the backside LTD layer 818 is deposited at a given temperature. For example, in some embodiments, the dielectric material that forms the LTD layer 818 is deposited at a temperature of 180° C.

The unannealed dielectric material that forms the LTD layer 818 may generally have worse dielectric properties than those of a thermal oxide. However, annealing the LTD layer 818 can greatly improve the dielectric properties of the LTD layer 818. Accordingly, at step 708, the backside LTD layer 818 is microwave annealed to improve the dielectric properties of the LTD layer 818. In conventional annealing processes (e.g., thermal annealing processes), the LTD layer 818 is annealed at a temperature substantially higher than the deposition temperature of the LTD layer 818. For example, in some embodiments, the LTD layer 818 is annealed at a temperature of 250° C. However, annealing the LTD layer using microwave annealing processes allows for the layer 818 to be annealed at a temperature substantially lower than the temperature at which thermal annealing processes occur. For example, in some embodiments, the layer 818 can microwave annealed at a temperature lower than the temperature at which the backside layer 818 was deposited.

The ability to improve the properties of the LTD layer 818 at a temperature lower than the deposition temperature is desirable. In some embodiments, the deposited LTD layer may be annealed using microwave methods at temperatures less than 180° C., less than 160° C., less than 120° C., less than 80° C., or less than 50° C. to modify the stress in the coated LTD layer. The densified back side dielectric layer can improve structural integrity of the semiconductor element and can obviate the use of high temperature processes to densify the dielectric.

In embodiments where a carrier and an adhesive are used to support the semiconductor element 800 during the thinning process, the microwave annealing process can be performed at a temperature lower than the upper recommended processing temperature for the carrier. For example, in some embodiments, the carrier can have an upper recommended processing temperature of 230° C. In conventional annealing processes where annealing is performed in a conventional oven at a temperature of 250° C. or higher, the annealing process occurs at temperatures higher than the recommend processing temperature of 230° C. for the temporary carrier adhesive. Accordingly, conventional annealing processes can cause the temporary carrier to degrade prematurely, which can result in warpage or damage to the semiconductor component. Conversely, because microwave annealing can be performed at a temperature below the upper recommended temperature for the carrier, microwave annealing the LTD layer 818 does not result in degradation or the temporary carrier.

After annealing the backside dielectric layer 818, at step 710, the annealed back side dielectric layer 818 can be planarized and further processed. In some embodiments, the further processing can include annealing the planarized substrate in a microwave oven at selected temperatures for selected times. In some embodiments, additional planarization steps may also be performed after the additional microwave anneal if needed.

At step 712, the bonding surfaces of one or more other substrates can be prepared for bonding, and at step 714, the other substrates can then be bonded to the densified and planarized back side dielectric layer 818 of the semiconductor element 800. At step 716, the bonded structure can then be microwave annealed to form a permanent bond between the bonded substrates.

In some embodiments, a low temperature microwave process may be applied to repair the warpage of a thinned singulated before bonding operation. A thinned cleaned singulated die may be removed from the dicing sheet to measure the warpage of the die. For example, a thinned 50-micron thick dies with lateral dimensions of 8 mm×12 mm having a warpage greater than 50 microns may not be desirable for direct bonding. Exposing the highly warped die to microwave processing may be used to reduce the warpage of the die to a desirable determine warpage of less than 20 microns, less than 10 microns, or less than 5 microns. The restorative process may be then applied to the remaining dies on the dicing sheet to reduce the warpage of the dies to the desirable determined warpage. The restored dies can be cleaned and prepared for a bonding operation. The microwave die warpage restorative operation may be performed at a temperature lower than 80° C., lower than 40° C., lower than 25° C., lower than 0° C., or lower than –25° C. The treatment times in the microwave oven may range between less than 60s to less than 600s.

Figure 9A:
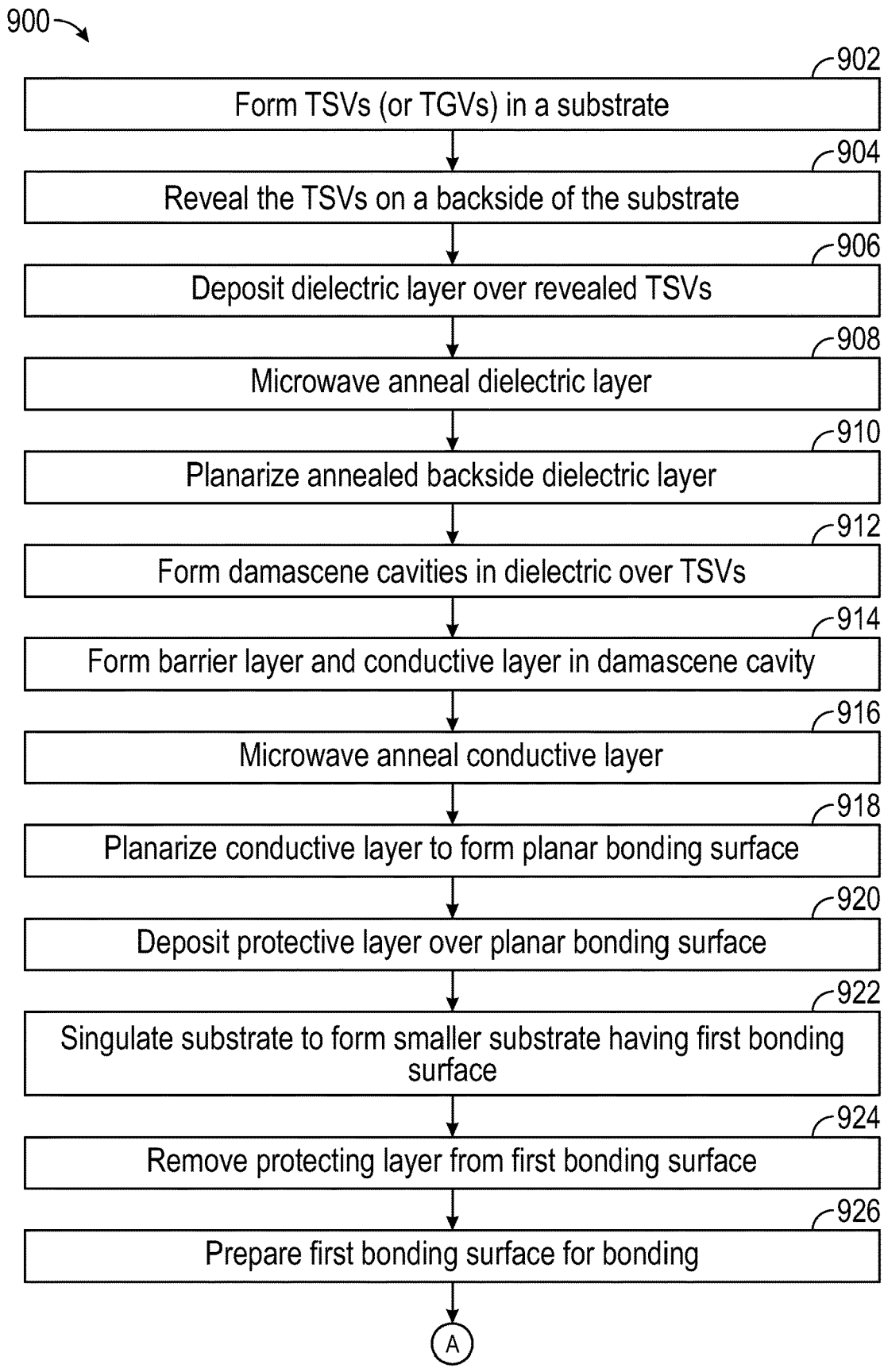
FIGS. 9A and 9B are a flowchart illustrating another process for reducing die warpage in a TSV reveal process, according to embodiments.
Figure 9B:
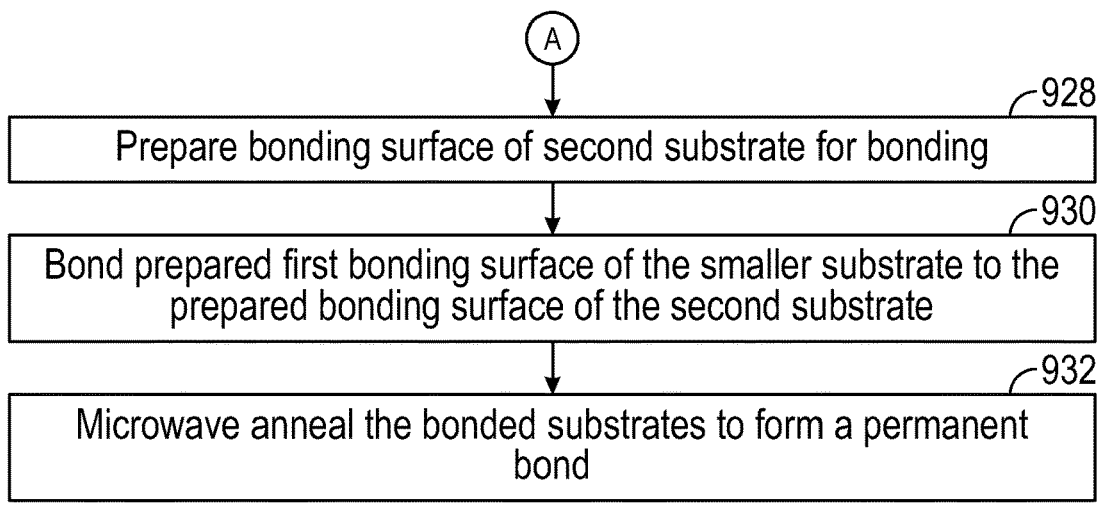

FIGS. 9A and 9B are a flowchart illustrating a process 900 for reducing die warpage in a TSV reveal process, according to another embodiment. Unless otherwise noted, features or steps of FIGS. 9A and 9B may be the same as or generally similar to the features or steps of FIGS. 2, 4, 6A, 6B, and 7. Specifically, steps 902-910 of the process 900 can be generally similar to steps 702-710 of process 700 shown in FIG. 7. However, unlike the process 700 of FIG. 7, after planarizing the annealed backside dielectric layer, additional conductive features (e.g., copper TSVs and/or bond pads) are formed in the semiconductor element. Specifically, at step 912, one or more damascene cavities is formed in the dielectric layer deposited over the substrate. At step 914, barrier and conductive layers are provided in the one or more cavities. At step 916, the conductive layer in the cavities (e.g., a copper TSV or pad) microwave annealed to densify and the conductive material. In some embodiments, the conductive layer is microwave annealed at a temperature lower than the temperature at which the back side dielectric layer was deposited on the semiconductor element. In other embodiments, the microwave metal densification can be omitted in favor of a conventional thermal anneal. After microwave annealing the conductive layer, at step 918, the front side of the semiconductor element is planarized to remove portions of the conductive layer, thereby forming a planar bonding surface. At step 920, a protective layer is deposited over the planar bonding surface and then, at step 922, the semiconductor element is singulated to form a smaller substrate having a first bonding surface. At step 924, the protective layer is removed from the first bonding surface and then, at step 926, the first bonding surface is prepared for bonding. For example, in some embodiments, the first bonding surface can be activated. At step 928, a bonding surface for a second substrate is prepared for bonding. At step 930, the first bonding surface and the bonding surface of the second substrate are bonded together. At step 932, the bonded substrates are microwave annealed to form a permanent bond.

Figure 10:
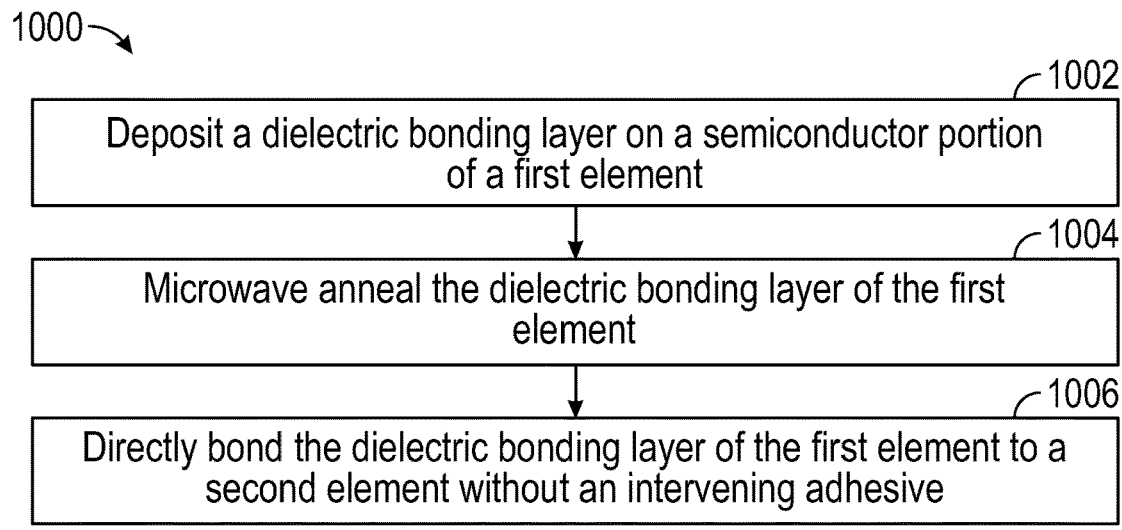
FIG. 10 is a flowchart illustrating a process for reducing die warpage and improving device yield, according to embodiments.

FIG. 10 is a flowchart illustrating a process 1000 for reducing die warpage and improving device yield. At step 1002, a dielectric bonding layer is deposited on a semiconductor portion of a first element. At step 1004, the dielectric bonding layer is microwave annealed. Microwave annealing dielectric bonding layer can serve to balance stresses within the dielectric bonding layer and can make the bonding layer more stoichiometric. In some embodiments, the dielectric bonding layer can be microwave annealed at a temperature that is lower than the temperature at which the dielectric bonding layer was deposited. At step 1006, the dielectric bonding layer of the first element can be directly bonded to a second element without using an intervening adhesive.

Figure 11:
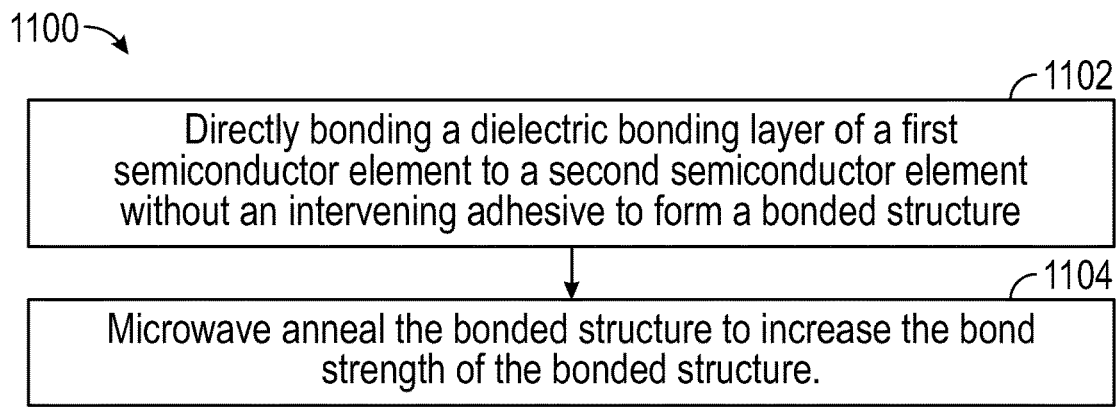
FIG. 11 is a flowchart illustrating another process for reducing die warpage and improving device yield, according to embodiments.

FIG. 11 is a flowchart illustrating a process 1100 for reducing die warpage and improving device yield. At step

1102, a dielectric bonding layer of a first semiconductor element is directly bonded to a second semiconductor element without an intervening adhesive to form a bonded structure. At step 1104, the bonded structure is microwave annealed to increase the bond strength of the bonded structure. In some embodiments, after microwave annealing the bonded structure, the bonded structure can be singulated using known singulation methods.

In the embodiments disclosed herein, the dielectric layers (e.g., the dielectric bonding layer, the dielectric liner, the back side dielectric layer) may comprise silicon oxide, silicon nitride, silicon carbide, silicon oxycarbonitride, silicon carbonitride, or any other suitable dielectric material. Such materials can be referred to as inorganic materials despite the inclusion of carbon in some such materials. The bonding layer of such inorganic dielectric materials may include, after activation, a higher concentration of nitrogen and/or fluorine at the bonding surface, as compared to the bulk material of the layer. Nitrogen can be provided as a terminating species to increase bond strength and tends to remain concentrated at the bond interface after bonding. Fluorine can be provided, for example, in oxide-based materials and congregates at both upper and lower interfaces of the bonding layer. Fluorine content in an oxide material can aid in formation of microvoids near the interface, which in turn can aid diffusion.

In one embodiment, a bonding method can include microwave annealing a dielectric bonding layer of a first element by exposing the dielectric bonding layer to microwave radiation to densify the dielectric bonding layer; and after the microwave annealing, directly bonding the dielectric bonding layer of the first element to a second element without an intervening adhesive.

In some embodiments, the method can include depositing the dielectric bonding layer on a semiconductor portion of the first element at a first temperature and microwave annealing the dielectric bonding layer at a second temperature lower than the first temperature. In some embodiments, the first temperature is in a range of 180° C. to 350° C. In some embodiments, the second temperature is in a range of 20° C. to 175° C. In some embodiments, depositing the dielectric bonding layer comprises plasma depositing the dielectric bonding layer. In some embodiments, plasma depositing comprises depositing by plasma enhanced chemical vapor deposition (PECVD). In some embodiments, the method can include plasma depositing at a temperature less than 170° C. In some embodiments, the method can include comprising thinning the first element. In some embodiments, the method can include polishing the dielectric bonding layer after the microwave annealing. In some embodiments, the method can include activating for direct bonding after the polishing. In some embodiments, the method can include thermally heating the dielectric bonding layer during the microwave annealing. In some embodiments, the dielectric bonding layer is not thermally heating in a furnace during the microwave annealing. In some embodiments, microwave annealing comprises exposing the dielectric bonding layer to a plurality of different microwave frequencies. In some embodiments, microwave annealing comprises exposing the dielectric bonding layer to one or a plurality of frequencies in a range of 2 GHz to 15 GHz. In some embodiments, the method can include directly bonding a plurality of conductive contacts at least partially embedded in the dielectric bonding layer to a plurality of conductive contacts of the second element without an intervening adhesive. In some embodiments, the method can include forming the plurality of conductive contacts in the dielectric bonding layer after the microwave annealing, and subsequently performing a second microwave anneal to densify the plurality of conductive contacts. In some embodiments, the method can include, after the directly bonding, performing an additional microwave anneal to increase a bond strength between the first and second elements. In some embodiments, the method can include providing a dielectric liner in the first element, and, after providing the dielectric liner, performing an additional microwave anneal to densify the dielectric liner. In some embodiments, the method can include providing a plurality of through substrate vias (TSVs) exposed through a back side of the first element; providing a dielectric layer over the exposed TSVs; and after providing the dielectric layer, additionally microwave annealing the element to densify the dielectric layer. In some embodiments, providing the plurality of TSVs comprises providing the plurality of TSVs before the directly bonding. In some embodiments, providing the plurality of TSVs comprises providing the plurality of TSVs after the directly bonding. In some embodiments, the method can include directly bonding the first element in wafer form to the second element in wafer form. In some embodiments, the method can include directly bonding the first element in singulated die form to the second element.

In another embodiment, a method for forming a semiconductor element can include depositing a dielectric bonding layer on a semiconductor portion at a first temperature; after the depositing, microwave annealing the dielectric bonding layer by exposing the dielectric bonding layer to microwave radiation at a second temperature lower than the first temperature to densify the dielectric bonding layer; and preparing the dielectric bonding layer for direct bonding to another element.

In some embodiments, the first temperature is in a range of 150° C. to 350° C. In some embodiments, the second temperature is in a range of 20° C. to 175° C. In some embodiments, the dielectric bonding layer comprises silicon oxide. In some embodiments, preparing the dielectric bonding layer for direct bonding comprises activating the dielectric bonding layer by exposing the dielectric bonding layer to a nitrogen plasma. In some embodiments, depositing comprises plasma depositing.

In another embodiment, a method for forming a semiconductor element can include forming a cavity in the semiconductor element; forming a dielectric liner in the cavity at a first temperature; and after the forming, microwave annealing the semiconductor element by exposing the semiconductor element to microwave radiation at a second temperature lower than the first temperature to densify the dielectric liner.

In some embodiments, the method can include, after the microwave annealing, providing a conductive layer in the cavity. In some embodiments, providing the conductive layer comprises providing a conductive through substrate via (TSV) in the semiconductor element.

In another embodiment, a bonding method can include directly bonding a dielectric bonding layer of a first semiconductor element to a second element without an intervening adhesive to form a bonded structure; and after the directly bonding, microwave annealing the bonded structure to increase a bond strength of the bonded structure by exposing the bonded structure to microwave radiation.

In some embodiments, the method can include directly bonding a plurality of conductive contacts at least partially embedded in the dielectric bonding layer to a plurality of conductive contacts in the second semiconductor element without an intervening adhesive. In some embodiments, the method can include depositing the dielectric bonding layer on a semiconductor portion of the first semiconductor element, and, after the depositing but before the directly bonding, microwave annealing the semiconductor element to densify the dielectric bonding layer. In some embodiments, the depositing is performed at a first temperature and the annealing the first semiconductor element is performed at a second temperature lower than the first temperature.

In another embodiment, a method for forming a semiconductor element can include forming a cavity in a dielectric layer of the semiconductor element; providing a conductive layer in the cavity; and after providing the conductive layer, microwave annealing the first semiconductor element by exposing the semiconductor element to microwave radiation to densify the conductive layer.

In some embodiments, the method can include planarizing the semiconductor element to form a planar bonding surface and directly bonding the semiconductor element to another semiconductor element without an intervening adhesive.

In another embodiment, a method for forming a semiconductor element can include providing a plurality of through substrate vias (TSVs) exposed through a back side of the semiconductor element; providing a dielectric layer over the exposed TSVs; and after providing the dielectric layer, microwave annealing the semiconductor element to densify the dielectric layer.

In some embodiments, the method can include planarizing the back side of the semiconductor element including the TSVs and directly bonding the back side of the semiconductor element to another semiconductor element without an intervening adhesive. In some embodiments, the method can include mounting the semiconductor element to a carrier with an adhesive during the providing the dielectric layer and during the microwave annealing. In some embodiments, providing the dielectric layer comprises plasma depositing the dielectric layer at a temperature less than 170° C.

In another embodiment, a method for forming a semiconductor element can include forming a dielectric layer on an element; microwave annealing the element; and forming a cavity in the element.

In some embodiments, microwave annealing the element comprises exposing the element to microwave radiation at a second temperature lower than a first temperature at which the dielectric layer was formed to densify the dielectric liner. In some embodiments, the method can include forming a conductive layer in the cavity of in element. In some embodiments, the method can include annealing the formed metal by microwave annealing. In some embodiments, the method can include planarizing the element to form a bonding surface having a planar dielectric portion and an embedded conductive layer.

In another embodiment, a method for reducing the warpage of an element can include measuring the warpage of an element; and exposing the warped element to microwave radiation at a temperature in a range of −25° C. to 150° C. to reduce the warpage of the element to or below a determined value.

In some embodiments, the warped element can have an off specification warpage, larger than the determined warpage. In some embodiments, the warped element comprises a wafer or a singulated element. In some embodiments, the exposing the warped element to microwave radiation is performed while the warped element is disposed on a dicing sheet. In some embodiments, the method can include cleaning the bonding surface of the restored warped element and bonding the bonding surface of the restored element to another substrate.

In another embodiment, a bonding method includes: exposing a dielectric bonding layer of a first element to microwave radiation; and after exposing the dielectric bonding layer to microwave radiation, directly bonding the dielectric bonding layer of the first element to a second element without an intervening adhesive.

In another embodiment, a method of forming a microelectronic assembly includes: preparing a bonding surface of a first substrate; preparing a bonding surface of a second substrate; mounting the second substrate to a dicing frame; singulating the second substrate into a plurality of dies while the second substrate is mounted to the dicing frame; activating the bonding surface of the first substrate; directly bonding the bonding surface of one of the plurality of singulated dies to the bonding surface of the first substrate without an adhesive to form the microelectronic assembly; and annealing the microelectronic assembly in a microwave oven or in ambient conditions.

In some embodiments, the method can include singulating the microelectronic assembly. In some embodiments, the first or second substrate comprises a partially embedded conductive layer formed at the respective first or second bonding surface. In some embodiments, the microelectronic assembly is microwave annealed at a temperature that is less than 200° C. In some embodiments, the microelectronic assembly is microwave annealed at a temperature that is less than 180° C. In some embodiments, at least one of the first and second substrates comprises one or metal recesses having a depth that is less than 30 nm, less than 20 nm, or less than 10 nm. In some embodiments, the first substrate comprises a first conductive layer, the singulated die comprises a second conductive layer, and directly bonding the bonding surface of the singulated die to the bonding surface of the first substrate without an adhesive comprises bonding the singulated die and the first such that the first conductive layer contacts the second conductive layer.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonding method comprising:
   microwave annealing a dielectric bonding layer of a first element by exposing the dielectric bonding layer to microwave radiation;
   after the microwave annealing, forming a plurality of conductive contacts in the dielectric bonding layer; and
   after the forming the plurality of conductive contacts in the dielectric bonding layer, directly hybrid bonding the dielectric bonding layer of the first element to a second element without an intervening adhesive.

2. The bonding method of claim 1, wherein the first element comprises a semiconductor portion, the method further comprising:
   depositing the dielectric bonding layer on the semiconductor portion at a first temperature, wherein the microwave annealing of the dielectric bonding layer is performed at a second temperature lower than the first temperature.

3. The bonding method of claim 2, wherein the first temperature is in a range of 180° C. to 350° C. and wherein the second temperature is in a range of 20° C. to 175° C.

4. The bonding method of claim 2, wherein depositing the dielectric bonding layer comprises plasma depositing the dielectric bonding layer by plasma enhanced chemical vapor deposition (PECVD) at a temperature less than 170° C.

5. The bonding method of claim 1, further comprising thinning the first element.

6. The bonding method of claim 1, further comprising polishing the dielectric bonding layer after the microwave annealing.

7. The bonding method of claim 6, further comprising activating the dielectric bonding layer for direct bonding after the polishing.

8. The bonding method of claim 1, further comprising thermally heating the dielectric bonding layer during the microwave annealing.

9. The bonding method of claim 1, wherein the microwave annealing comprises exposing the dielectric bonding layer to a plurality of different microwave frequencies.

10. The bonding method of claim 1, wherein the microwave annealing comprises exposing the dielectric bonding layer to one or a plurality of frequencies in a range of 2 GHz to 15 GHz.

11. The bonding method of claim 1, wherein the plurality of contacts comprises a first plurality of conductive contacts and wherein the second element comprises a second plurality of conductive contacts, the method further comprising:
   after directly bonding the dielectric bonding layer of the first element to the second element, directly bonding the first plurality of conductive contacts to the second plurality of conductive contacts without an intervening adhesive.

12. The bonding method of claim 11, further comprising after forming the first plurality of conductive contacts in the dielectric bonding layer, performing a second microwave anneal to densify the first plurality of conductive contacts.

13. The bonding method of claim 1, further comprising, after the directly bonding, performing an additional microwave anneal to increase a bond strength between the first and second elements.

14. The bonding method of claim 1, further comprising:
   providing a plurality of through substrate vias (TSVs) exposed through a back side of the first element;
   providing a dielectric layer over the exposed TSVs; and
   after providing the dielectric layer, microwave annealing the first element to densify the dielectric layer.

15. The bonding method of claim 14, wherein providing the plurality of TSVs comprises providing the plurality of TSVs before directly bonding the dielectric bonding layer to the second element.

16. The bonding method of claim 14, wherein providing the plurality of TSVs comprises providing the plurality of TSVs after directly bonding the dielectric bonding layer to the second element.

17. A method for forming a semiconductor element, the method comprising:
   depositing a dielectric bonding layer on a semiconductor portion at a first temperature;
   after the depositing, microwave annealing the dielectric bonding layer by exposing the dielectric bonding layer to microwave radiation at a second temperature lower than the first temperature;
   after the microwave annealing, forming a plurality of conductive contacts in the dielectric bonding layer; and
   after the forming, preparing the dielectric bonding layer for hybrid bonding to another element.

18. The method of claim 17, wherein the first temperature is in a range of 150° C. to 350° C.

19. The bonding method of claim 18, wherein the second temperature is in a range of 20° C. to 175° C.

20. The bonding method of claim 17, wherein the dielectric bonding layer comprises silicon oxide.

21. The bonding method of claim 20, wherein preparing the dielectric bonding layer for direct bonding comprises activating the dielectric bonding layer by exposing the dielectric bonding layer to a nitrogen plasma.

22. The bonding method of claim 17, wherein the depositing comprises plasma depositing.

23. A bonding method, comprising:
- exposing a dielectric bonding layer of a first element to microwave radiation;
- after the exposing the dielectric bonding layer to microwave radiation, forming a plurality of conductive contacts in the dielectric bonding layer; and
- after the forming the plurality of conductive contacts in the dielectric bonding layer, directly hybrid bonding the dielectric bonding layer of the first element to a second element without an intervening adhesive.

* * * * *